United States Patent
Mak et al.

(10) Patent No.: US 9,680,448 B2
(45) Date of Patent: Jun. 13, 2017

(54) GAIN-BOOSTED N-PATH PASSIVE-MIXER-FIRST RECEIVER WITH A SINGLE MIXING STEP

(71) Applicant: University of Macau, Macau (CN)

(72) Inventors: Pui-In Mak, Macau (CN); Zhicheng Lin, Macau (CN); Rui Paulo da Silva Martins, Macau (CN)

(73) Assignee: UNIVERSITY OF MACAU, Macau (CN)

( * ) Notice: Subject to any disclaimer, the term of this patent is extended or adjusted under 35 U.S.C. 154(b) by 0 days.

(21) Appl. No.: 14/862,392

(22) Filed: Sep. 23, 2015

(65) Prior Publication Data

US 2016/0233906 A1 Aug. 11, 2016

Related U.S. Application Data

(60) Provisional application No. 62/112,363, filed on Feb. 5, 2015.

(51) Int. Cl.
*H04B 1/16* (2006.01)
*H03H 11/04* (2006.01)
(Continued)

(52) U.S. Cl.
CPC ....... *H03H 11/0472* (2013.01); *H03B 5/1246* (2013.01); *H03F 1/0205* (2013.01); *H03F 3/19* (2013.01); *H03F 3/45076* (2013.01); *H03H 11/1291* (2013.01); *H03H 19/002* (2013.01); *H03H 19/004* (2013.01); *H04B 1/16* (2013.01); *H04B 1/1638* (2013.01);
(Continued)

(58) Field of Classification Search
CPC .......... H03G 3/3036; H03G 3/30; H04B 1/00; H04B 1/005; H03H 7/0138; H03H 7/0115; H03H 19/002; H03H 7/01; H03F 1/565; H03F 1/223; H03F 3/195; H03F 2200/2942; H03F 2200/01; H03F 1/56
See application file for complete search history.

(56) References Cited

U.S. PATENT DOCUMENTS 4,443,757 A * 4/1984 Bui .................. H03H 19/004
324/76.19
4,733,205 A * 3/1988 Hughes .............. H03H 11/04
330/109
(Continued)

OTHER PUBLICATIONS

Z. Lin, P.-I. Mak and R. P. Martins, "A 0.5V 1.15mW 0.2mm2 Sub-GHz ZigBee Receiver Supporting 433/860/915/960MHz ISM Bands with Zero External Components," ISSCC Dig. Tech. Papers, pp. 164-165, Feb. 2014.
(Continued)

*Primary Examiner* — Pablo Tran
(74) *Attorney, Agent, or Firm* — Bacon & Thomas, PLLC

(57) ABSTRACT

The present invention discloses a gain-boosted n-path passive-mixer-first receiver. According to another aspect of the present disclosure, a gain-boosted n-path passive-mixer-first receiver is provided. The receiver includes a number n of switch-capacitor (sc) sets, a resistor, and a transconductance amplifier. The sc sets connect in parallel, and the sc sets have a first node and a second node. The resistor connects to the first node. The transconductance amplifier connects to the resistor and the second node.

2 Claims, 23 Drawing Sheets

(51) Int. Cl.
H03H 11/12 (2006.01)
H03H 19/00 (2006.01)
H03F 1/02 (2006.01)
H03F 3/19 (2006.01)
H03F 3/45 (2006.01)
H03B 5/12 (2006.01)

(52) U.S. Cl.
CPC ........ *H03B 5/1237* (2013.01); *H03B 2202/06* (2013.01); *H03F 2200/294* (2013.01); *H03F 2200/451* (2013.01); *H03H 2011/0483* (2013.01); *H03H 2210/025* (2013.01)

(56) References Cited

U.S. PATENT DOCUMENTS

| | | | | |
|---|---|---|---|---|
| 5,124,593 | A * | 6/1992 | Michel | H03H 11/04 327/554 |
| 5,724,000 | A * | 3/1998 | Quinn | H03H 19/004 327/554 |
| 5,841,310 | A * | 11/1998 | Kalthoff | G06G 7/1865 327/337 |
| 6,362,770 | B1 * | 3/2002 | Miller | H03M 1/1225 327/553 |
| 6,424,209 | B1 * | 7/2002 | Gorecki | H03H 11/1291 327/337 |
| 6,452,444 | B1 * | 9/2002 | Mehr | H03H 11/1291 327/554 |
| 6,628,163 | B2 * | 9/2003 | Dathe | H03H 11/1291 327/553 |
| 6,701,340 | B1 * | 3/2004 | Gorecki | G06J 1/00 708/671 |
| 7,116,159 | B2 * | 10/2006 | Fleischhacker | H03H 11/04 327/337 |
| 7,157,945 | B2 * | 1/2007 | Ohnhauser | G01R 19/1659 327/553 |
| 7,719,348 | B2 * | 5/2010 | Ullmann | H03H 19/004 327/337 |
| 8,299,850 | B1 * | 10/2012 | Kutz | H03K 25/04 330/260 |
| 9,264,268 | B2 * | 2/2016 | Nienaber | H04B 1/0003 |
| 9,374,063 | B1 * | 6/2016 | Mak | H03H 19/004 |
| 2013/0271210 | A1 * | 10/2013 | Riley | H03H 19/002 327/554 |
| 2014/0132357 | A1 * | 5/2014 | Larson | G03F 1/223 330/303 |

OTHER PUBLICATIONS

Z. Lin, P.-I. Mak and R. P. Martins, "A 1.7mW 0.22mm2 2.4GHz ZigBee RX Exploiting a Current-Reuse Blixer + Hybrid Filter Topology in 65nm CMOS," ISSCC Dig. Tech. Papers, pp. 448-449, Feb. 2013.
F. Lin, P.-I. Mak and R. P. Martins, "An RF-to-BB Current-Reuse Wideband Receiver with Parallel N-Path Active/Passive Mixers and a Single-MOS Pole-Zero LPF," ISSCC Dig. Tech. Papers, paper 3.9, Feb. 2014.
F. Zhang, K. Wang, J. Koo, Y. Miyahara and B. Otis, "A 1.6mW 300mV Supply 2.4 GHz Receiver with −94 dBm Sensitivity for Energy-Harvesting Applications," ISSCC Dig. Tech. Papers, pp. 456-457, Feb. 2013.
A. Ghaffari, E. Klumperink, M. Soer and B. Nauta, "Tunable High-Q N-Path Band-Pass Filters: Modeling and Verification," IEEE J. of Solid-State Circuits, vol. 46, pp. 998-1010, May 2011.
J. Sinderen, G. Jong, F. Leong, et al., "Wideband UHF ISM-Band Transceiver Supporting Multichannel Reception and DSSS Modulation," ISSCC Dig. Tech. Papers, pp. 454-455, Feb. 2013.
M. Tedeschi, A. Liscidini and R. Castello, "Low-Power Quadrature Receiver for ZigBee (IEEE 802.15.4) Applications," IEEE J.Solid-State Circuits, vol. 45, pp. 1710-1719, Sep. 2010.

Z. Lin, P.-I. Mak and R. P. Martins, "Analysis and Modeling of a Gain-Boosted N-Path Switched-Capacitor Bandpass Filter," IEEE Trans. Circuits Syst. I, Reg. Papers, vol. 9, pp. 2560-2568, Sep. 2014.
C. Andrews and A. Molnar, "A Passive Mixer-First Receiver with Digitally Controlled and Widely Tunable RF Interface," IEEE J. of Solid-State Circuits, vol. 45, pp. 2696-2708, Dec. 2010.
C. Andrews and A. Molnar, "Implications of Passive Mixer Transparency for Impedance Matching and Noise Figure in Passive Mixer-First Receivers," IEEE Trans. Circuits Syst. I, Reg. Papers, vol. 57, pp. 3092-3103, Dec. 2010.
D. Murphy, H. Darabi, A. Abidi, A. Hafez, A. Mirzaei, M. Mikhemar, and M. Chang, "A Blocker-Tolerant, Noise-Cancelling Receiver Suitable for Wideband Wireless Applications," IEEE J. of Solid-State Circuits, vol. 47, No. 12, pp. 2943-2963, Dec. 2012.
M. Darvishi, R. van der Zee, and B. Nauta, "Design of Active N-Path filters," IEEE J. of Solid-State Circuits, vol. 48, No. 12, pp. 2962-2976, Dec. 2013.
A. Mirzaei, H. Darabi, A. Yazdi, Z. Zhou, E. Chang, and P. Suri, "A 65 nm CMOS Quad-Band SAW-Less Receiver SOC for GSM/GPRS/EDGE," IEEE J. Solid-State Circuits, vol. 46, No. 4, pp. 950-964, Apr. 2011.
A. Mirzaei, H. Darabi and D. Murphy, "A Low-Power Process-Scalable Superheterodyne Receiver with Integrated High-Q filters," ISSCC Dig. Tech. Papers, pp. 60-61, Feb. 2011.
S. Youssef, R. van der Zee, and B. Nauta, "Active Feedback Technique for RF Channel Selection in Front-End Receivers" IEEE J. Solid-State Circuits, vol. 47, pp. 3130-3144, Dec. 2012.
M. Darvishi, R. van der Zee, E. Klumperink, and B. Nauta, "Widely Tunable 4th Order Switched Gm-C Band-Pass Filter Based on N-Path Filters," IEEE J. Solid-State Circuits, vol. 47, No. 12, pp. 3105-3119, Dec. 2012.
M. Soer, E. Klumperink, P. deBoer, F. vanVliet, and B. Nauta, "Unified Frequency Domain Analysis of Switched-Series-RC Passive Mixers and Samplers," IEEE Trans. Circuits Syst. I, Reg. Papers, vol. 57, No. 10, pp. 2618-2631, Oct. 2010.
A. Ghaffari, E. Klumperink, M. Soer, and B. Nauta, "Tunable N-Path Notch Filters for Blocker Suppression: Modeling and Verification," IEEE J. Solid-State Circuits, vol. 48, pp. 1370-1382, Jun. 2013.
A. Mirzaei and H. Darabi, "Analysis of Imperfections on Performance of 4-Phase Passive-Mixer-Based High-Q Bandpass Filters in SAWless Receivers," IEEE Trans. Circuits Syst. I, Reg. Papers, vol. 58, No. 5, pp. 879-892, May 2011.
A. Mirzaei, H. Darabi, J. Leete et al., "Analysis and Optimization of Direct-Conversion Receivers With 25% Duty-Cycle Current-Driven Passive Mixers," IEEE Trans. Circuits Syst. I, Reg. Papers, vol. 57, pp. 2353-2366, Sep. 2010.
A. Mirzaei, H. Darabi, H., D. Murphy, "Architectural Evolution ofIntegrated M-Phase High-Q Bandpass Filters," IEEE Trans. Circuits Syst. I, Reg. Papers, vol. 59, No. 1, pp. 52-65, Jan. 2012.
Lin, P.-I. Mak and R. P. Martins, "A Sub-GHz Multi-ISM-Band ZigBee Receiver Using Function-Reuse and Gain-Boosted N-Path Techniques for IoT Applications", IEEE Journal of Solid-State Circuits, vol. 49, issue 12, pp. 2990-3004, Dec. 2014.
J. A. Stankovic, "Research Directions for the Internet of Things," IEEE Internet of Things Journal, vol. 1, No. 1, pp. 3-9, Feb. 2014.
A. Zanella, N. Bui, A. Castellani, L. Vangelista and M. Zorzi, "Internet of Things for Smart Cities," IEEE Internet of Things Journal, vol. 1, No. 1, pp. 22-32, Feb. 2014.
A. Wong, M. Dawkins, G. Devita, et. al., "A 1V 5mA Multimode IEEE 802.15.6/Bluetooth Low-Energy WBAN Transceiver for Biotelemetry Applications," ISSCC Dig. Tech. Papers, pp. 300-301, Feb. 2012.
B. W. Cook, A. Berny, A. Molnar, S. Lanzisera, and K. Pister, "Low-Power, 2.4-GHz Transceiver with Passive RX Front-End and 400-mV Supply," IEEE J. of Solid-State Circuits, vol. 41, pp. 2767-2775, Dec. 2006.
Z. Lin, P.-I. Mak and R. P. Martins, "A 0.14-mm2 1.4-mW 59.4-dB-SFDR 2.4GHz ZigBee/WPAN Receiver Exploiting a "Split-LNTA+50% LO" Topology in 65-nm CMOS," IEEE Trans. Microw. Theory Techn., vol. 62, No. 7, pp. 1525-1534, Jul. 2014.

(56) References Cited

OTHER PUBLICATIONS

J. Han and R. Gharpurey, "Recursive Receiver Down-Converters With Multiband Feedback and Gain-Reuse" IEEE J. of Solid-State Circuits, vol. 43, pp. 1119-1131, Sep. 2008.
F. Zhang, Y. Miyahara and B. Otis, "Design of a 300-mV 2.4-GHz Receiver Using Transformer-Coupled Techniques," IEEE J. of Solid-State Circuits, vol. 48, pp. 3190-3205, Dec. 2013.
Z. Lin, P.-I. Mak and R. P. Martins, "A 2.4-GHz ZigBee Receiver Exploiting an RF-to-BB-Current-Reuse Blixer + Hybrid Filter Toploly in 65-nm CMOS," IEEE J. of Solid-State Circuits, vol. 49, pp. 1333-1344, Jun. 2014.

* cited by examiner

GAIN-BOOSTED N-PATH PASSIVE-MIXER-FIRST RECEIVER WITH A SINGLE MIXING STEP

BACKGROUND OF THE INVENTION

1. Field of the Invention

The present invention relates to a receiver, especially relates to a gain-boosted n-path passive-mixer-first receiver.

2. Description of the Prior Art

With the continued maturation of the Internet of Things (IoT), a huge market has been opening up for short-range ultra-low-power (ULP) wireless connectivity. The IoT market will be close to hundreds of billion dollars (annually ~16 billions) in 2020. To bring down the hardware cost of such massive inter-connections, sub-GHz ULP wireless products compliant with the existing wireless standard such as the IEEE 802.15.4c/d (ZigBee) will be of great demand, especially for those that can cover all regional ISM bands [e.g., China (433 MHz), Europe (860 MHz), North America (915 MHz) and Japan (960 MHz)]. Together with the obvious goals of small chip area, minimum external components and ultra-low-voltage (ULV) supply (for possible energy harvesting), the design of such a receiver poses significant challenges.

The tradeoffs among multi-band operation, power, area and noise figure (NF) are described in FIG. 1. A multi-band receiver [FIG. 1(a)] can be resorted from multiple low-noise amplifier (LNAs) with shared I/Q mixers and baseband (BB) lowpass filters (LPFs). As such, each LNA and its input matching network can be specifically optimized for one band using passive-LC resonators, improving the NF, selectivity and gain. Although a single wideband LNA with zero LC components is preferred to reduce the die size [FIG. 1(b)], the NF and power requirements of the LNA are much higher. Moreover, when the output noise of the LNA is wideband, more harmonic-folding noise will be induced by its subsequent mixers (under hard switching). All these facts render wideband receivers generally more power hungry than its narrowband counterparts.

In contrast, a wide-range-tunable narrowband RF front-end is of greater potential to realize a multi-band ULP receiver. While sub-GHz passive LC resonators are area hungry, the N-path switched-capacitor (SC) network appears as a prospective alternative to replace them. It behaves as a tunable lossy LC resonator with its center frequency accurately defined by the clock. Inspired by it, present invention introduces a function-reuse RF front-end with signal orthogonality, and a gain-boosted N-path SC network for tunable RF filtering and input impedance matching. External components are avoided, while multi-band operation, stronger RF filtering, smaller physical capacitor size, and lower LO power are concurrently achieved when compared with the traditional designs. Together with a low-voltage current-reuse VCO-filter, the described multi-band receiver exhibits comparable performances with respect to other single-band-optimized designs.

SUMMARY OF THE INVENTION

According to one aspect of the present invention, a gain-boosted n-path passive-mixer-first receiver is provided. The receiver includes a transconductance amplifier, a number n of capacitors, a node, and a number n of switches. The capacitors connect to a output of the transconductance amplifier. The node connects to an input of the transconductance amplifier. The resistor connects to the input. The switches connected between the resistor and the capacitors.

According to another aspect of the present disclosure, a gain-boosted n-path passive-mixer-first receiver is provided. The receiver includes a number n of switch-capacitor (sc) sets, a resistor, and a transconductance amplifier. The sc sets connect in parallel, and the sc sets have a first node and a second node. The resistor connects to the first node. The transconductance amplifier connects to the resistor and the second node.

BRIEF DESCRIPTION OF THE DRAWINGS

The present disclosure can be more fully understood by reading the following detailed description, with reference made to the accompanying drawings as follows:

FIG. 4a-2 is a diagram showing a 4-path tunable receiver;

DETAILED DESCRIPTION OF THE PREFERRED EMBODIMENT

Figure 1A:
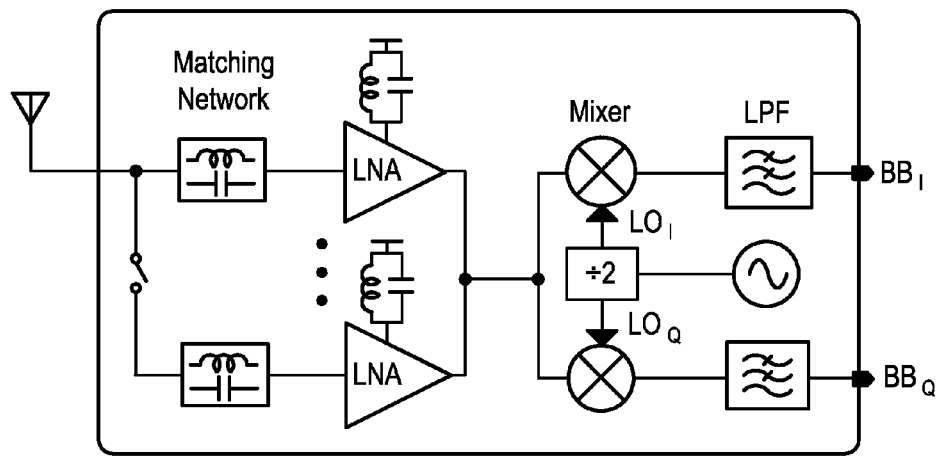
FIG. 1a is a schematic diagram showing a multi-band receiver using multiple LNAs and matching networks for pre-gain and pre-filtering.
Figure 1B:
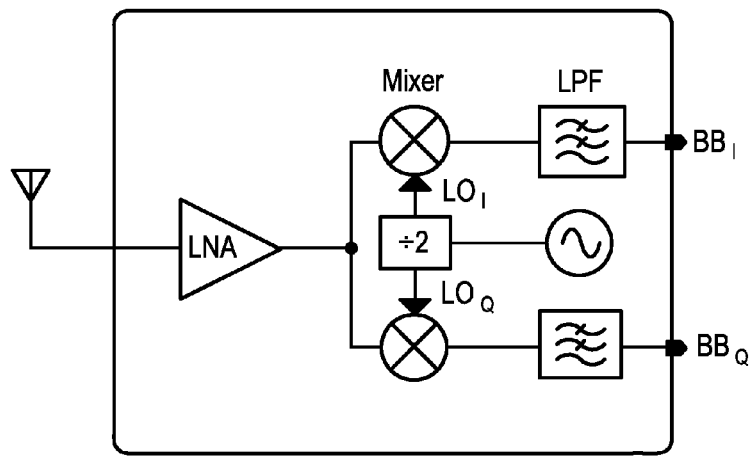
FIG. 1b is a schematic diagram showing a multi-band receiver using one wideband LNA to save the die area but demanding more power to lower the NF and nonlinearity due to no pre-gain, no pre-filtering and more harmonic-folding noise.

Entered into the nanoscale CMOS regime, the transistors feature sufficiently high $f_T$ and low $V_T$ favoring the use of a current-reuse architecture. Moreover, by conveying the signal in the current domain, both the RF bandwidth and linearity can be improved. Our previous work was inspired by those facts; it unifies most RF-to-BB functions in one cell for current-mode signal processing at a typical 1.2-V supply, resulting in a high IIP3 (−6 dBm) at small power (2.7 mW) and area (0.3 mm$^2$). Yet, for power savings, another 0.6-V supply was still required for the rest of the circuitries, complicating the power management. In some work, the 2.4-GHz ULV receiver facilitates single 0.3-V operation of the entire receiver at 1.6 mW for energy harvesting, but the limited voltage headroom and transistor $f_T$ call for bulky inductors and transformers to assist the biasing and tune out the parasitics, penalizing the area (2.5 mm$^2$). Finally, since both of them target only the 2.4-GHz band, a fixed LC network can be employed for input matching and passive pre-gain (save power). This technique is however costly and inflexible for multi-band designs.

The described multi-band receiver is based on a function-reuse RF front-end implemented with a gain-boosted N-path SC network. The cost is low and die area is compact (0.2 mm$^2$) as on/off-chip inductors and transformers are all avoided except the VCO. The power is squeezed by recycling a set of inverter-based amplifiers for concurrent RF (common mode) and BB (differential mode) amplification, resulting in low-voltage (0.5 V) and low-power (1.15 mW) operation.

Gain-Boosted N-Path SC Networks

The gain-boosted N-path SC network can generate an RF output when it is considered as a LNA or bandpass filter, or BB outputs when it is considered as a receiver (this work). We describe three alternatives to realize and study such a network. With the linear periodically time-variant (LPTV) analysis, the BB signal transfer function (STF) and noise transfer function (NTF) are derived and analyzed. Besides, three intuitive functional views are given to model their gain responses.

A. N-Path Tunable Receiver

Figure 2:
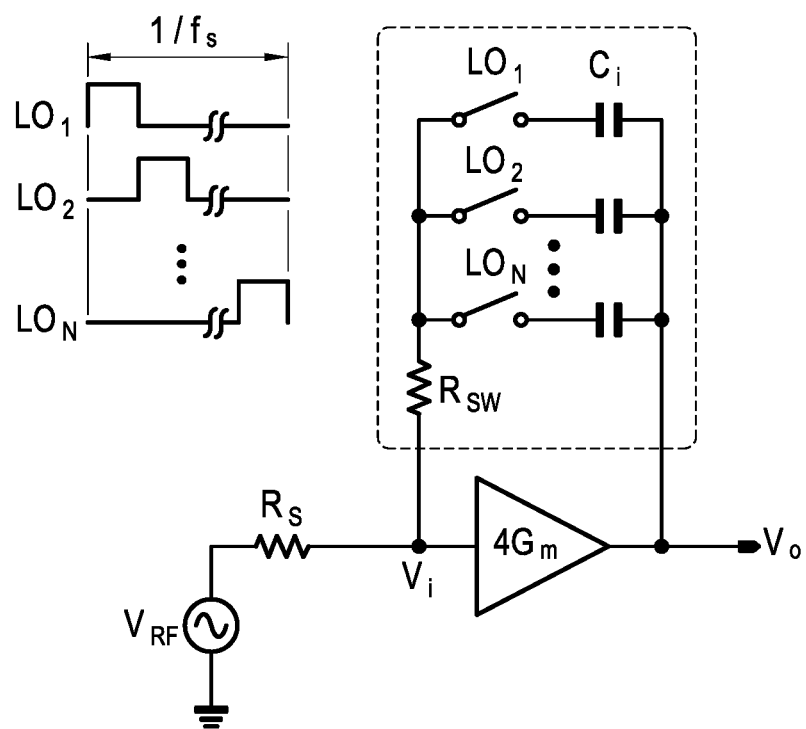
FIG. 2 is a schematic diagram showing a N-path tunable LNA or bandpass filter.
Figure 3A:
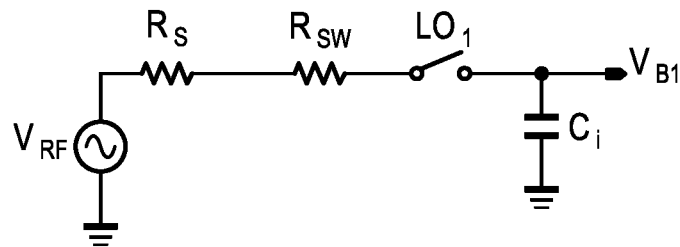
FIG. 3a illustrates a schematic diagram showing a single-path passive mixer.
Figure 3B:
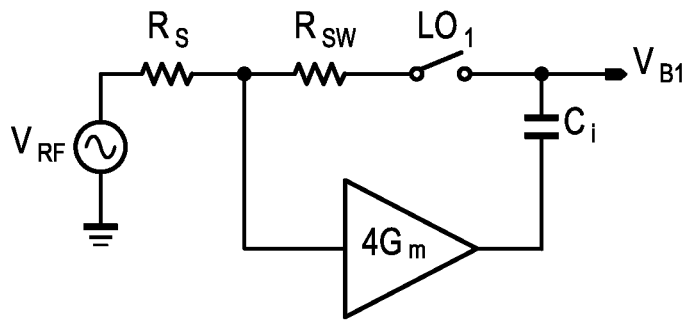
FIG. 3b illustrates a schematic diagram showing a single-path passive mixer with gain boosting.
Figure 3C:
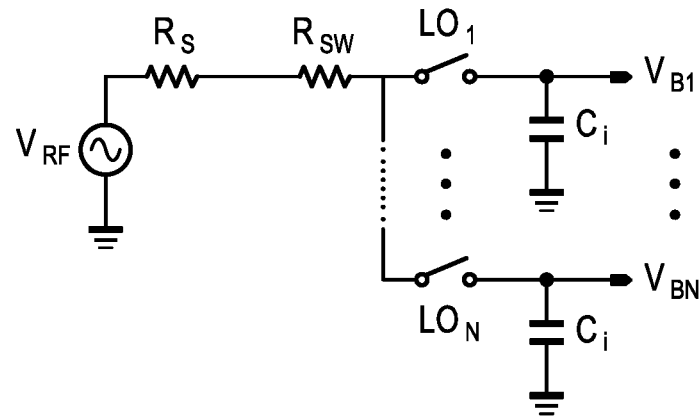
FIG. 3c illustrates a schematic diagram showing an N-path passive mixer.
Figure 3D:
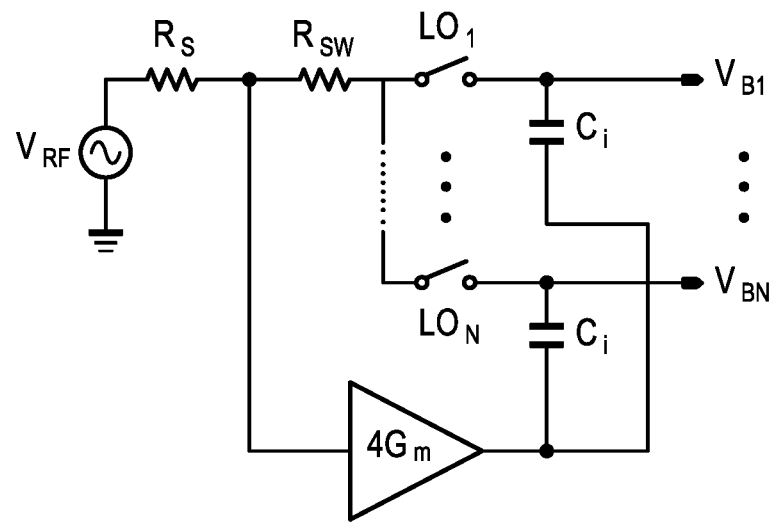
FIG. 3d illustrates the N-path tunable LNA in FIG. 2 being re-arranged as an N-path tunable receiver by taking the BB outputs at VB1-N on top of Ci, like an N-path passive mixer with gain boosting.

By having an N-path SC network as the feedback path of a gain stage (labeled with the symbol $4G_m$), an N-path tunable LNA (or bandpass filter) can be realized with the RF output taken at $V_o$ (FIG. 2). This topology has a number of core benefits when compared with the existing N-path filtering. First, double-RF filtering at $V_i$ and $V_o$ is achieved with one N-path SC network. Second, tunable input impedance matching is possible at $V_i$. Third, the loop gain associated with $4G_m$ reduces the impact of $R_{sw}$ (mixer's ON resistance) to the ultimate out-of-band (OB) rejection. Fourth, similar to the continuous-time Miller capacitor, for a given RF bandwidth (BW), the required $C_i$ can be reduced by the loop gain associated with $4G_m$. Fifth, the NTF of $R_{sw}$ to $V_o$ is a notch function around the clock frequency $f_s$. Thus, small switches are allowed without degrading the NF, saving the LO power. Finally, the output noise at $V_o$ is narrowband with a comb-filter shape, reducing the harmonic-folding noise when it is followed by a wideband passive mixer.

Interestingly, if such an operation principle is extended to FIG. 3(a) to (d), the N-path tunable LNA can be viewed as a passive-mixer receiver, with all capacitors $C_i$ driven by a $4G_m$ stage. The BB outputs are taken at $V_{B1-N}$. Unlike the original passive-mixer-first receiver that offers no gain at $V_{B1-N}$, this receiver has a relatively large BB gain at $V_{B1-N}$ surmounting the NF limitation. The frequency-translational RF filtering at $V_i$ and $V_o$ are realized by $LO_1$-$LO_N$ to upconvert the BB signals $V_{B1-N}$ to RF, and in-phase summed together.

Figures 1, 4A:
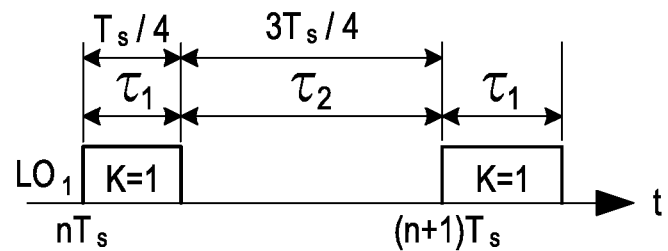
FIG. 4a-1 is a diagram showing a timing diagram of LO1.
Figures 2, 4A:
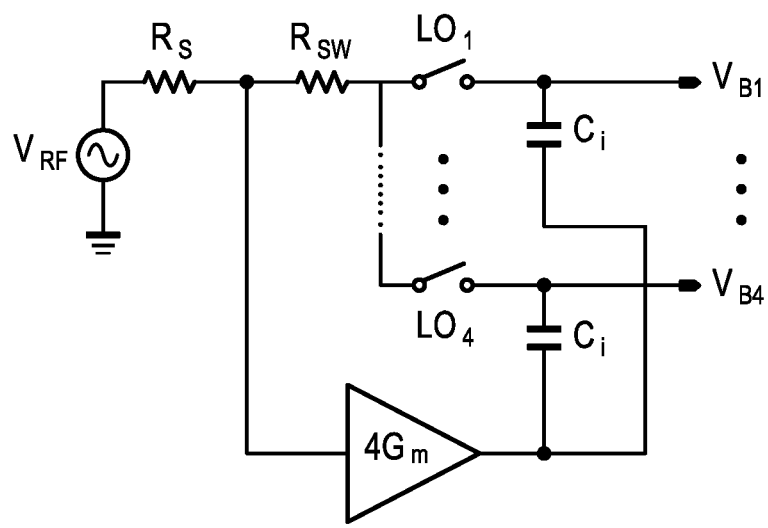
Figure 4B:
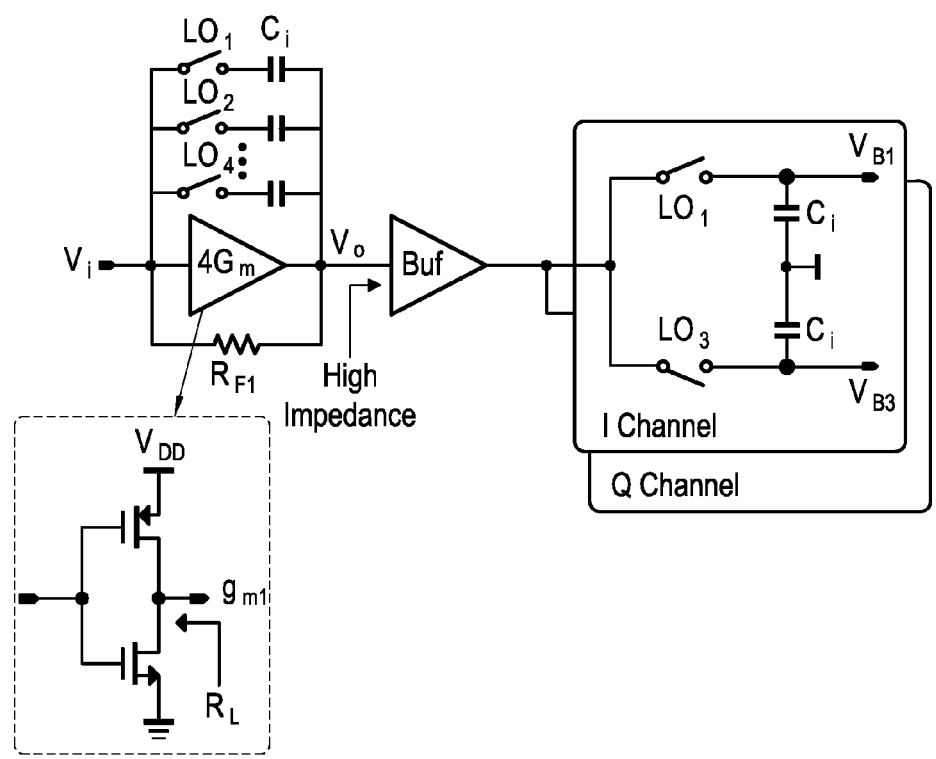
FIG. 4b is a diagram showing functional view of a 4-path tunable receiver to model the gain response.

To establish a basic operation theory, the analysis below follows the LPTV method. For simplicity, N=4 is employed to allow basic I/Q downconversion with $LO_1$-$LO_4$ as 25%- duty-cycle non-overlapping clocks. The timing diagram of $LO_1$ is shown in FIG. 4(a)-1. $4G_m$ can be based on a self-biased inverter amplifier with $g_{m1}$ as the transconductance, $R_L$ as the output resistance and $R_{F1}$ as the feedback resistor. $LO_{2-4}$ are similar to $LO_1$ with a time delay (shown in FIG. 4-(a)-2). The analysis is conducted for $V_{B1}$ while for $V_{B2-4}$, when $f_{RF}$ is around $qf_s$, the phase relation between the BB voltages $V_{Bi}$ (1≤i≤4) can be described by $$V_{Bm} = V_{Bn}e^{\frac{jq\pi(m-n)}{2}},$$

(1≤(m,n)≤4). Thus, $V_{B1}$ and $V_{B3}$ ($V_{B2}$ and $V_{B4}$) are either out-of-phase or in-phase with each other, depending on the input frequency. When $LO_1$ is high (K=1), linear analysis reveals the following state-space description, $$\frac{dv_{Ci}(t)}{dt} = \frac{v_{RF}(t)}{C_i R_1} - \frac{v_{Ci}(t)}{C_j R_2} \quad (1)$$

where $$R_1 = \frac{1 + \frac{R_{sw}}{R_{F1}} + \frac{R_{sw}+R_s}{R_L} + \frac{R_{sw}R_s}{R_{F1}R_L} + g_{m1}R_s + \frac{g_{m1}R_{sw}R_s}{R_{F1}}}{\frac{1}{R_L} + g_{m1}} \quad (2)$$

$$R_2 = \frac{1 + \frac{R_{sw}}{R_{F1}} + \frac{R_{sw}+R_s}{R_L} + \frac{R_{sw}R_s}{R_{F1}R_L} + g_{m1}R_s + \frac{g_{m1}R_{sw}R_s}{R_{F1}}}{\frac{1}{R_{F1}} + \frac{1}{R_L} + \frac{R_s}{R_{F1}R_L} + \frac{g_{m1}R_s}{R_{F1}}} \quad (3)$$

When $LO_1$ is low (K=2), we have $$\frac{dv_{Ci}(t)}{dt} = 0 \quad (4)$$

From (1)-(4), the harmonic transfer functions (HTFs) for the intervals K=1 and K=2 are derived in (5) and (6), respectively, $$H_{n,1,RF}(j\omega) = \frac{\omega_{rt,B}}{\omega_{rt,A}+j\omega} \times \frac{1-e^{jn\omega_s\tau_1}}{j2\pi n} + \frac{1-e^{j\omega\tau_2}}{\omega_{rt,A}+j\omega}G(j\omega)f_s \quad (5)$$

$$H_{n,2,RF}(j\omega) = -\frac{1-e^{j\omega\tau_2}}{j\omega}G(j\omega)f_a \quad (6)$$

where, $$G(j\omega) = \frac{e^{j(\omega-N\omega_s)\tau_1} - e^{-\omega_{rt,A}\tau_1}}{e^{j2\pi(\omega-n\omega_s)/\omega_s} - e^{-\omega_{rt,A}\tau_1}} \times \frac{1}{\frac{\omega_{rt,A}}{\omega_{rt,B}} + \frac{j(\omega-n\omega_s)}{\omega_{rt,B}}} \quad (7)$$

$\omega_{rc,A}$=1/R2Ci, $\omega_{rc,B}$=1/RCi, $$\tau_1 = \frac{T_s}{4} \text{ and } \tau_2 = \frac{3T_s}{4}.$$

Here, $G(j\omega)$ represents the switching moment transfer function. By combining (5)-(7), the harmonics transfer function from $V_{RF}$ to $C_i$ is derived, $$H_{n,RF}(j\omega) = \frac{V_{Ci}(j\omega)}{V_{RF}(j\omega)} = H_{n,1,RF}(j\omega) + H_{n,2,RF}(j\omega) \quad (8)$$

For the BB signal around $f_s$, the voltages sampling at $C_i$ are differential, and $V_o$ is thus the virtual ground and the state of the circuit $V_{Ci(j\omega)}$ (voltage across $C_i$) is equal to $V_{Bm(j\omega)}$, where 1≤m≤4. Although the results from the LPTV analysis are exact, they are lacking in conceptual intuition that can be of more practical value for designers. To compare with the usual receiver concept that is based on cascade of blocks, a functional view of a 4-path tunable receiver is given in FIG. 4(b) to model the gain response. An ideal buffer amplifier (infinite input impedance and zero output impedance) is introduced into the model implying that the passive mixer has no loading effect to the front-end 4Gm stage. Note that the model is inapplicable for studying the noise, since the noise sources from the functional view are separated, and thus considered as uncorrelated. Differently with the noise sources of the proposed receiver, they are considered as correlated. From this functional view, the mixers are reused for two roles: double-RF filtering (i.e., as two N-path filters at both input and output of the gain stage) and frequency downconversion (i.e., as an N-path mixer). For the associated capacitors, they are also reused for both double-RF filtering (associated with the 4-path SC network) and BB filtering at $V_{B1-4}$. These properties lower the LO power and chip area while providing stronger RF filtering. For the RF gain at $V_o$, it can be derived by the upconversion of VB1-4 and summed together at $V_o$ as given by, $$v_o(t) = \sum_{m=1}^{4} v_{Bm}(t)LO_m(t) \quad (9)$$

Figure 5:
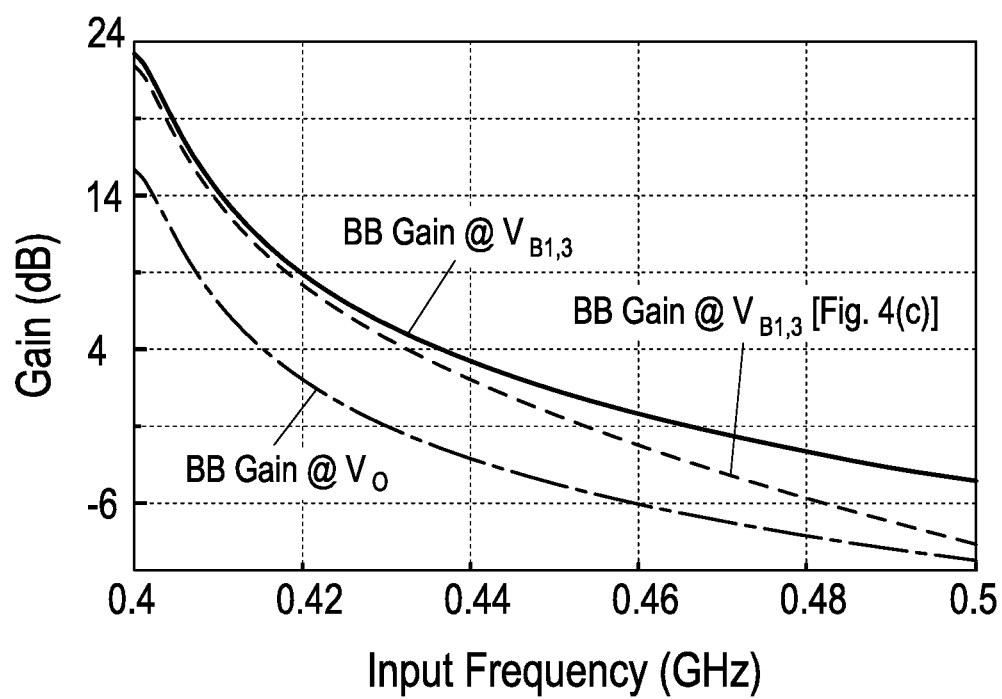
FIG. 5 is a diagram showing simulated BB gain and RF gain of the 4-path tunable receiver (FIG. 4a), and the simulated BB gain from the functional view in FIG. 4b.

After applying Fourier series analysis to (9) around $f_s$, we have, $$V_o(j\omega) = \frac{2\sqrt{2}}{\pi}V_{B1}(j\omega) = \frac{2\sqrt{2}}{\pi}V_{B1,3}(j\omega) \quad (10)$$

which is an approximation as the influence of $R_{sw}$ is ignored. Here $V_{B1,3}=V_{B1}-V_{B3}$. To verify it, the BB and RF STFs of the N-path tunable receiver are plotted together in FIG. 5. The RF gain is ~8 dB smaller than that of the BB gain, close to the prediction by (10). Also, the BB gain from the functional view is plotted, which fits well with the original gain-boosted in-band (IB) signal.

Figure 6A:
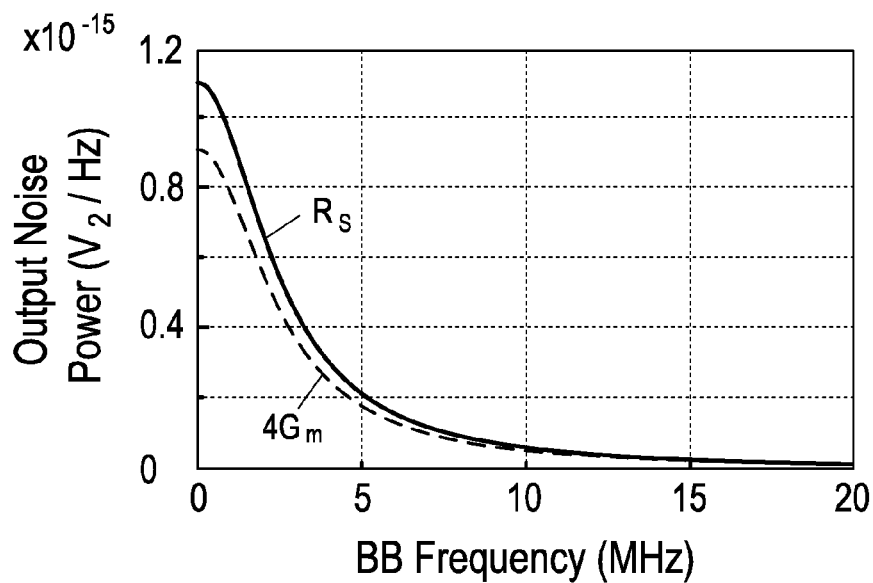
FIG. 6a is a diagram showing the simulated output-noise PSD at the differential BB outputs (VB1,3) due to Rs and 4Gm.
Figure 6B:
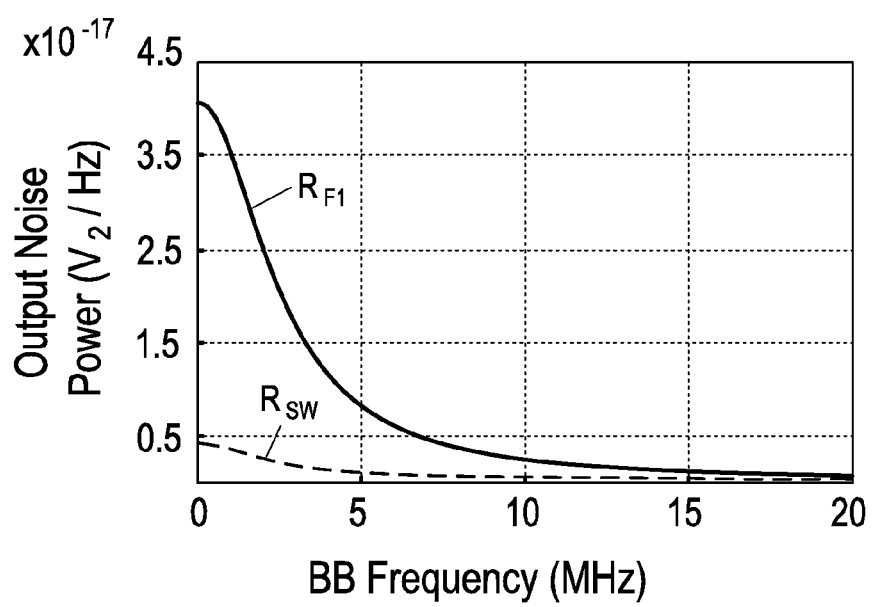
FIG. 6b is a diagram showing simulated output-noise PSD at the differential BB outputs (VB1,3)

The power spectral density (PSD) of the BB output noise is derived in Appendix A, while the PSD of the RF output noise at $V_o$ has been studied in some study. The simulated results are given in FIG. 6 (using the model of FIG. 16 in Appendix A). From simulations, the differential output noise power from $R_{sw}$ and $R_{F1}$ are much smaller (around two orders of magnitude) than that from $R_s$ and $4G_m$. Thus, the noise contributions from $R_{sw}$ and $R_{F1}$ are greatly suppressed, making small mixer's switches and large $R_{F1}$ possible (constrained by input impedance matching and the required RF filtering). Unlike the passive-mixer-first receiver where the BB NF from $R_{sw}$ is approximately ($R_{sw}/R_s+\gamma$), here γ is a factor from the harmonic folding. Thus, for the passivemixer-first design, the BB NF due to $R_{sw}$ is usually of a similar order of magnitude as $R_s$. Besides, a small $R_{sw}$ and additional LO paths are required to minimize such effect.

Figure 7:
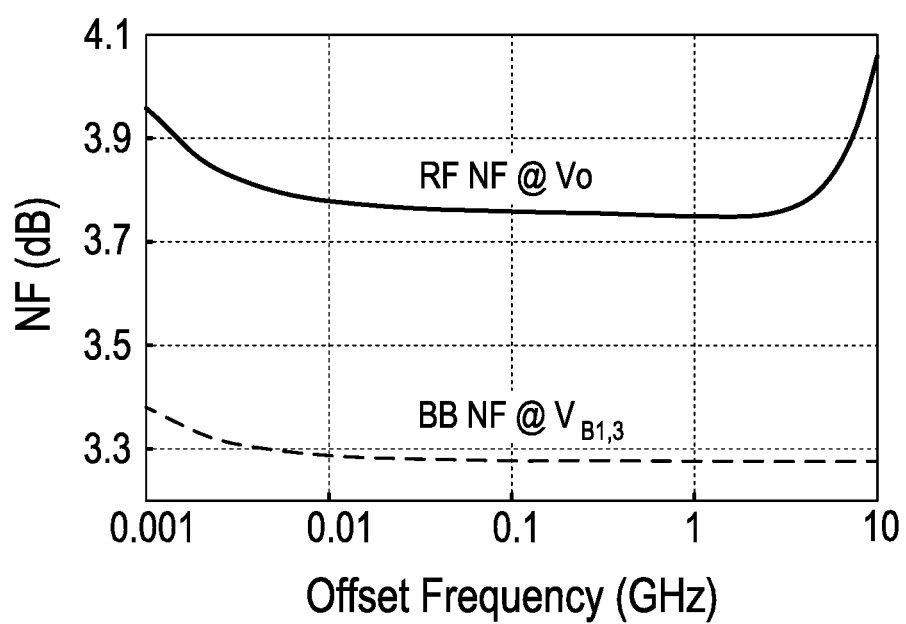
FIG. 7 is a diagram showing simulated NF of the N-path tunable receiver with the RF output or BB outputs.

We also show the simulated BB NF for $V_{B1,3}$ and RF NF at $V_o$ (FIG. 7), where $V_{B1,3}=V_{B1}-V_{B3}$ and similar notations such as $V_{X1,3}=V_{X1}-V_{X3}$ have the same implication in the following text. Interestingly, the BB NF is smaller than the RF NF at the LNA's output $V_o$, since the BB gain (or noise) and RF gain (or noise) are concurrent but happened under different STF (or NTFs). This characteristic underlines a fundamentally different concept when compared with the traditional receiver that is based on the cascade of blocks, where the RF NF should be smaller than the BB NF. Note that for the BB NF, the even-harmonic-folding noise due to the LO contributes only common-mode noise at the BB outputs, which will be rejected differentially. However, it will contribute to the RF noise at $V_o$ due to its single-ended nature. This is one of the senses that the BB NF can be smaller than the RF NF. The authors are still pursuing deeper exploration of this topic and this paper serves as the foundation. Furthermore, the 1/f noise around DC from the transconductance devices are upconverted to $f_s$ with little influence to the total output noise at DC. This was verified by simulations (FIG. 7) where the BB NF at 1 kHz has increased by only 0.15 dB. Thus, short channel-length devices can be employed without degrading the BB low-frequency noise.

B. AC-Coupled N-Path Tunable Receiver

Figure 8A:
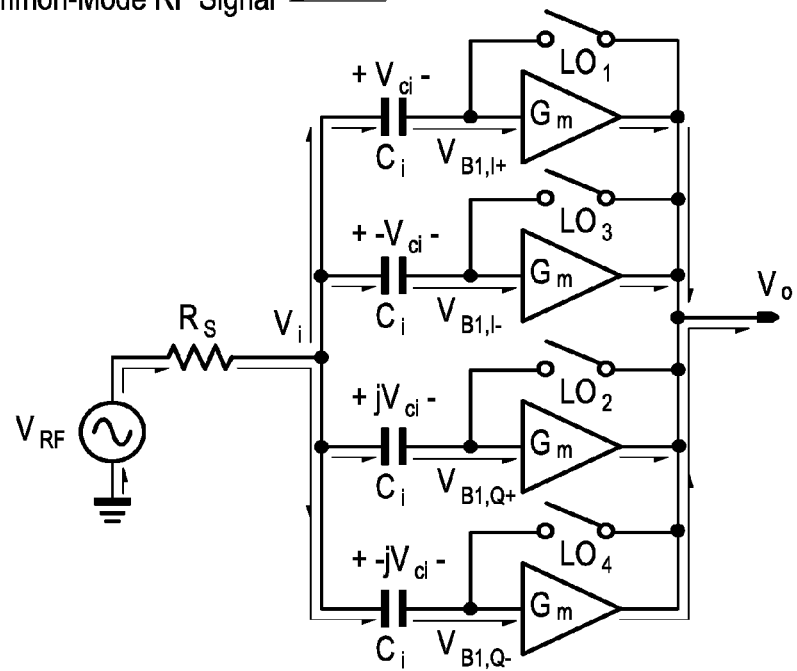
FIG. 8a is a diagram showing AC-coupled 4-path tunable receiver and its operation for RF signal.
Figure 8B:
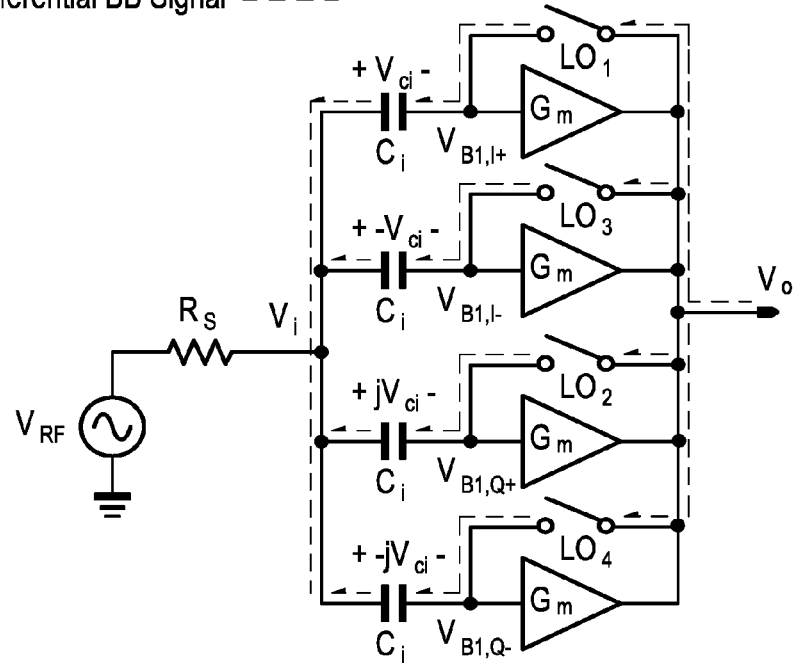
FIG. 8b is a diagram showing AC-coupled 4-path tunable receiver and its operation for BB signals.
Figure 8C:
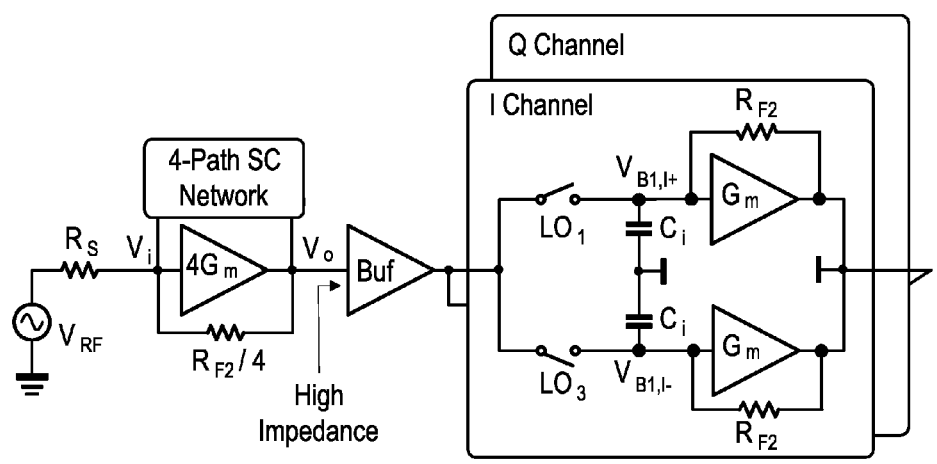
FIG. 8c is a diagram showing AC-coupled 4-path tunable receiver's functional view to model the gain response.

Another alternative to implement such a gain-boosted N-path SC network is shown in FIG. 8(a). The mixers are placed on the feedback path while the input is AC-coupled by capacitors that simplify the cascading of itself for a higher order of filtering. Without considering the memory effect of capacitor $C_i$, the operation of this architecture can be explained as follows: Initially, at RF frequency, the capacitor $C_i$ can be assumed as a short circuit. The input signal $V_{RF}$ is thus directly coupled to each gain stage $G_m$ ($G_m$ has a transconductance of $g_{m2}$, output resistance of $4R_L$, and feedback resistor of $R_{F2}$) and is amplified along path A [FIG. 8(a)] while the signal along the feedback path is downconverted to BB and summed at $V_o$, which will be zero since $LO_1$ and $LO_3$ are 180° out-of-phase with each other (the same is true for $LO_{2,4}$). After that, the amplified RF signal at $V_o$ is immediately down-converted to BB by the 4-path I/Q passive mixers along path B [FIG. 8(b)]. The BB signals at $V_{B1,I+}$ and $V_{B1,I-}$ are differential (the same is true for $V_{B1,Q+}$ and $V_{B1,Q-}$). Thus, node $V_i$ is a virtual ground. The I/Q BB signals will be amplified and summed together again at $V_o$, which should be zero. This process is explicitly modeled in FIG. 8(c). Similar to FIG. 4(b), an ideal buffer amplifier is inserted between the front-end gain stage (with small signal transconductance $g_{m1}$ and feedback resistor $R_{F2}/4$ for the $4G_m$ stage, as the 4 paths are parallelized) and I/Q passive mixers. When the memory effect of $C_i$ is accounted, the 4-path SC network can be modeled at the feedback path of the $4G_m$ stage, providing double-RF filtering at both its input and output nodes.

With sufficiently large $R_{F2}$, the voltages (i.e., the circuit states) sampling at $C_i$ are independent. Around the clock frequency, in the steady state, the BB voltages sampling at $C_i$ are $v_{Ci}(t)$, $jv_{Ci}(t)$, $-v_{Ci}(t)$ and $-jv_{Ci}(t)$ respectively for $LO_{1-4}$. When $LO_1$ is high, linear analysis shows the following state-space description, $$\begin{cases} \dfrac{C_i dv_{Ci}(t)}{dt} = \dfrac{v_o(t)}{R_L} + \left( \begin{matrix} v_{B1,I+}(t) + v_{B1,I-}(t) + \\ v_{B1,Q+}(t) + v_{B1,Q-}(t) \end{matrix} \right) g_{m2} \\ \dfrac{v_{RF}(t) - v_i(t)}{R_s} = \dfrac{C_i dv_{Ci}(t)}{dt} \\ v_i(t) = v_{Ci}(t) + v_o(t) + R_{sw} \dfrac{C_i dv_{Ci}(t)}{dt} \\ v_i(t) - v_{B1,I+}(t) = v_{Ci}(t) \\ v_i(t) - v_{B1,I-}(t) = -v_{Ci}(t) \\ v_i(t) - v_{B1,Q+}(t) = jv_{Ci}(t) \\ v_i(t) - v_{B1,Q-}(t) = -jv_{Ci}(t) \end{cases} \quad (11)$$

Simplifying (11), the same equation as in (1) is obtained, with $R_{F1}=\infty$ for $R_1$ and $R_2$. When $LO_1$ is low, it is in the hold mode, which can be described by (4). Thus, the same BB voltages $V_{B1,I\pm}$ ($V_{B1,Q\pm}$) as in GB-SC are expected. For the RF voltage at $V_o$, it can be evaluated by (10), rendering the same RF voltage gain as in FIG. 2. For the BB NTF from $G_m$, $R_{sw}$, $R_s$ and $R_{F2}$, they are also similar to those of FIG. 2 (not shown here).

If $R_{F2}$ is small, the voltage sampling at $C_i$ during each LO cycle will be leaked to the ground through $R_{F2}$, or coupled with other states at the output $V_o$. The effect of charge leakage or sharing will decrease both the BB and RF gains. In the proposed gain-boosted SC network, however, there is no such a problem since the charge stored at the capacitors is constant. Thus, this architecture has smaller gain than the gain-boosted N-path SC network under a finite feedback resistor with all other parameters unchanged. In a similar way, the AC-coupled N-path tunable receiver blocks the DC response, since at DC the charge stored at the capacitors Ci has infinite time to disappear.

C. Function-Reuse Receiver Embedding a Gain-Boosted N-Path SC Network

Figure 9A:
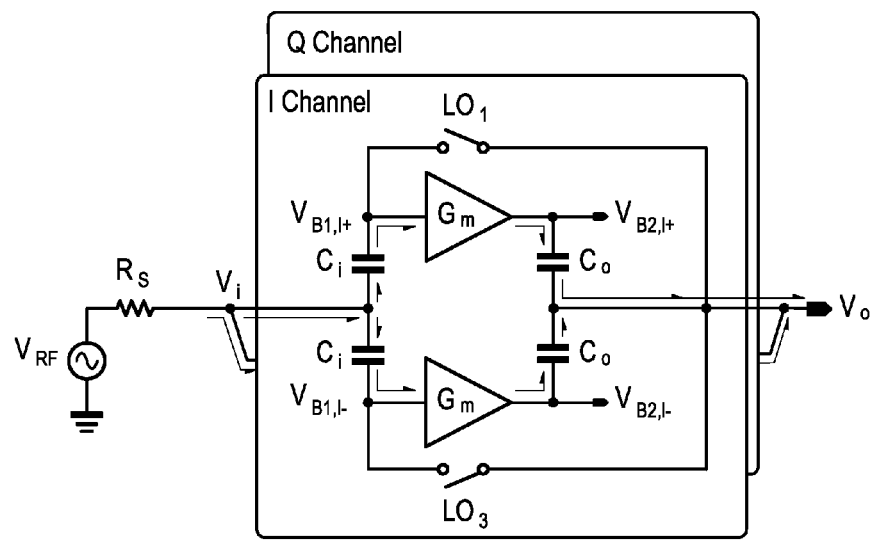
FIG. 9a is a diagram showing function-reuse receiver embedding a gain-boosted 4-path SC network and its operation for RF signal.
Figure 9B:
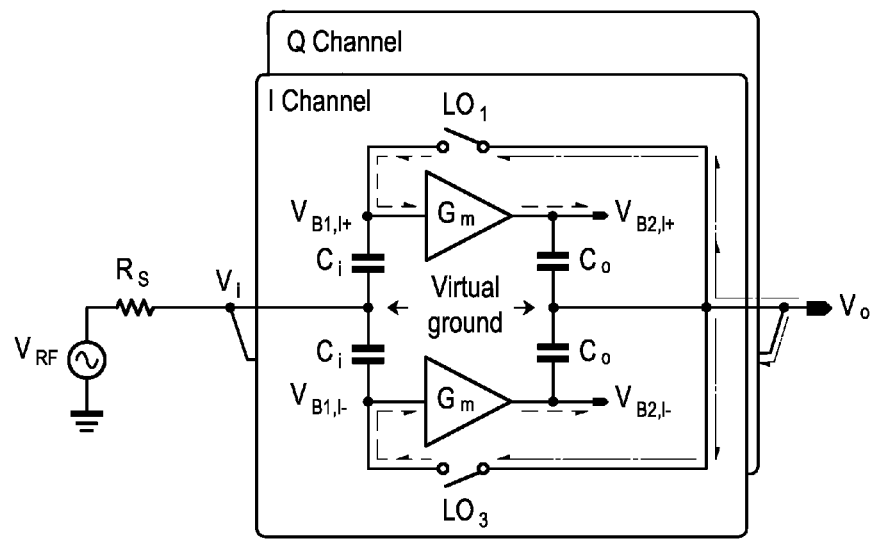
FIG. 9b is a diagram showing function-reuse receiver embedding a gain-boosted 4-path SC network and its operation for BB signals.
Figure 9C:
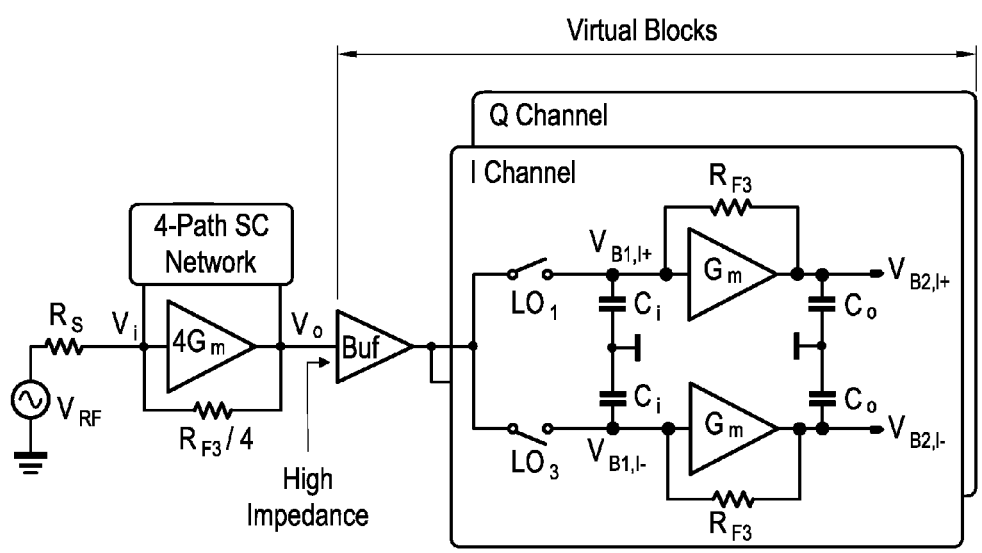
FIG. 9c is a diagram showing function-reuse receiver embedding a gain-boosted 4-path SC network's functional view to model the gain response, wherein the front-end gain stage 4Gm and its 4-path SC network follow the structure of FIG. 4b.

Unlike the AC-coupled N-path tunable LNA, the proposed function-reuse receiver with a gain-boosted 4-path SC network [FIG. 9(a)] separates the output of each gain stage $G_m$ ($G_m$ has a transconductance of $g_{m3}$, output resistance of $4R_L$, and feedback resistor of $R_{F3}$) with capacitor $C_o$ that is an open circuit at BB. The I/Q BB signals at $V_{B1,I\pm}$ and $V_{B1,Q\pm}$ are further amplified along the Path C [FIG. 9(b)] by each $G_m$ stage. With the memory effect of the capacitors, the functional view of the gain response is shown in FIG. 9(c). In order to achieve current-reuse between the RF LNA and BB amplifiers without increasing the supply, the circuit with an active mixer has a similar function. However, the BB NF behavior and the RF filtering behavior are different from the N-path passive mixer applied here that is at the feedback path. For the BB amplifiers, it is one $G_m$ with one $R_{F3}$, balancing the BB gain and OB-IIP3. After considering that the BB amplifiers have been absorbed in the LNA, the I/Q passive mixers and capacitors absorbed by the 4-path SC network, the blocks after the LNA can be assumed virtual. These virtual blocks reduce the power, area and NF. Similar to the AC-coupled N-path tunable LNA, with a relative small $R_{F3}$, the voltage sampling at $C_i$ in different phases will either leak to the ground, or couple with each other, lowering the BB and RF gains.

Figure 10A:
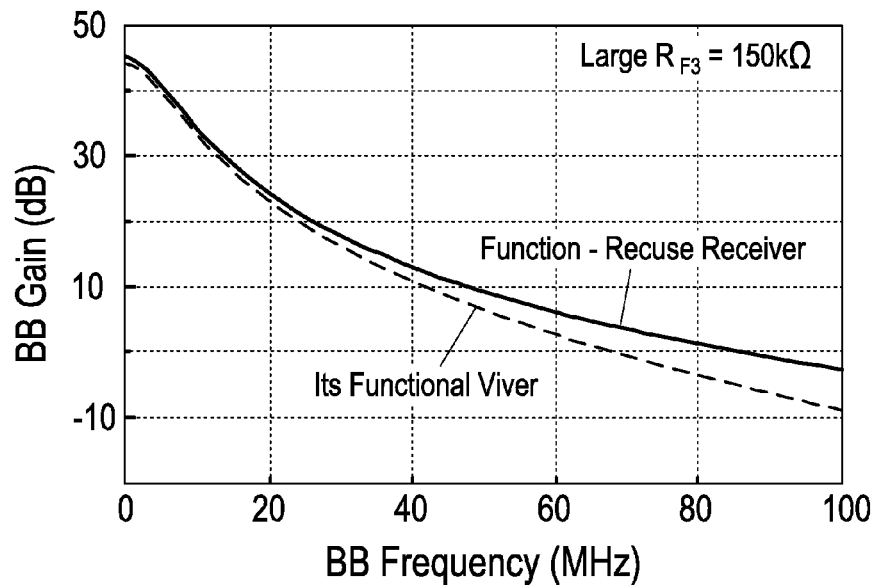
FIG. 10a is a diagram showing simulated BB gain response of the function-reuse receiver and its functional view with a large RF3.
Figure 10B:
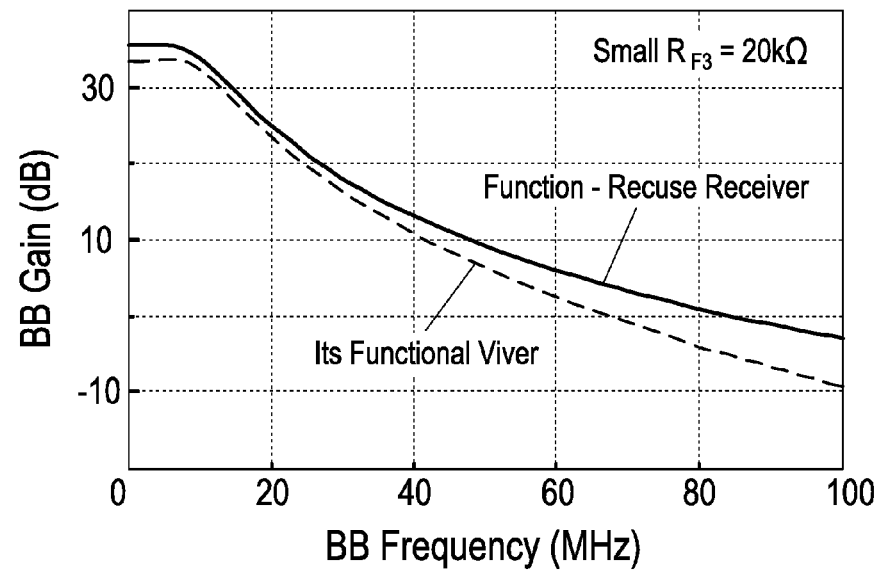
FIG. 10b is a diagram showing simulated BB gain response of the function-reuse receiver and its functional view with a small RF3.
Figure 11A:
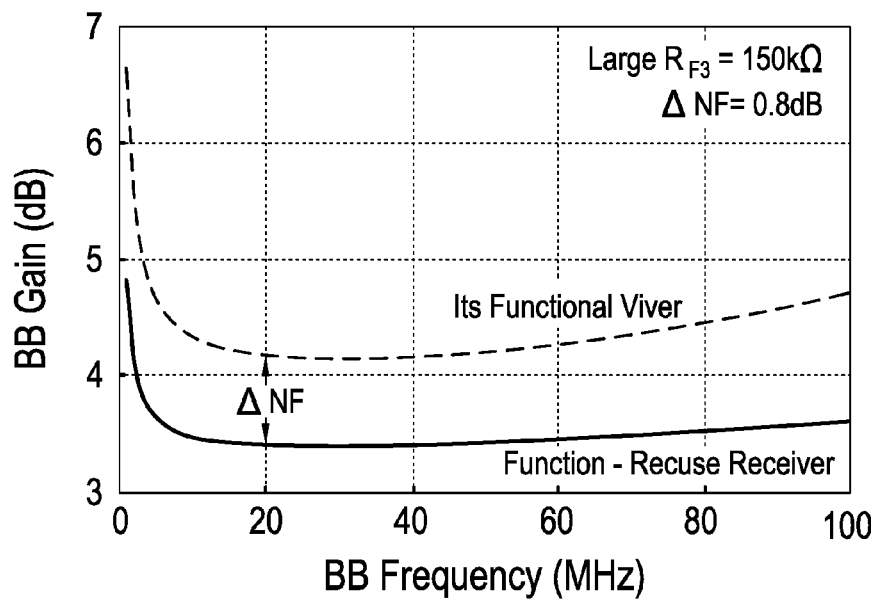
FIG. 11a is a diagram showing simulated BB NF of the function-reuse receiver and its functional view with a large RF3.

To validate the above analysis, the gain and noise performances under two sets of $R_{F3}$ are simulated. Here, the virtual blocks in FIG. 9(c) are implemented with physical transistors and capacitors for the BB amplifiers and the mixers while the buffer is ideal. Thus, the power of the modeled receiver is at least 2× larger than the proposed receiver. For the IB BB gain at $V_{B2,I\pm}$ ($V_{B2,Q\pm}$) between the proposed function-reuse receiver and its functional view, the difference is only 1 dB at a large $R_{F3}$ of 150 kΩ [FIG. 10(a)]. For a small $R_{F3}$, the gain error goes up to 2 dB [FIG. 10(b)], which is due to the gain difference between the model of the N-path tunable LNA [FIG. 9(c)] and the implementation of the function-reuse receiver that has AC-coupling. For the NF difference (ΔNF), with a large (small) $R_{F3}$, it is ~0.8 dB (3.5 dB) as compared in FIGS. 11(a) and (b). This is due to the lower gain at the LNA's output, forcing the input-referred noise from the downconversion passive mixers and the BB amplifiers to increase with a small $R_{F3}$. Either with a small or large $R_{F3}$, it is noteworthy that the variation of BB NF is small (i.e. for $R_{F3}$=20 kΩ it is 3.6 dB while for $R_{F3}$=150 kΩ it is 3.4 dB), because the BB NTF has a weak relation with $R_{F3}$. It also indicates that the BB NTF is weakly related with the gain at the LNA's output, which is dissimilar to the usual receiver where the NF should be small when the LNA's gain is large. Similarly, the NF at the LNA's output (now shown) can be larger than that at BB due to the different NTFs. The BB gain and the output noise at $V_{B2,I\pm}$ ($V_{B2,Q\pm}$) are further discussed in Appendix B.

Figure 11B:
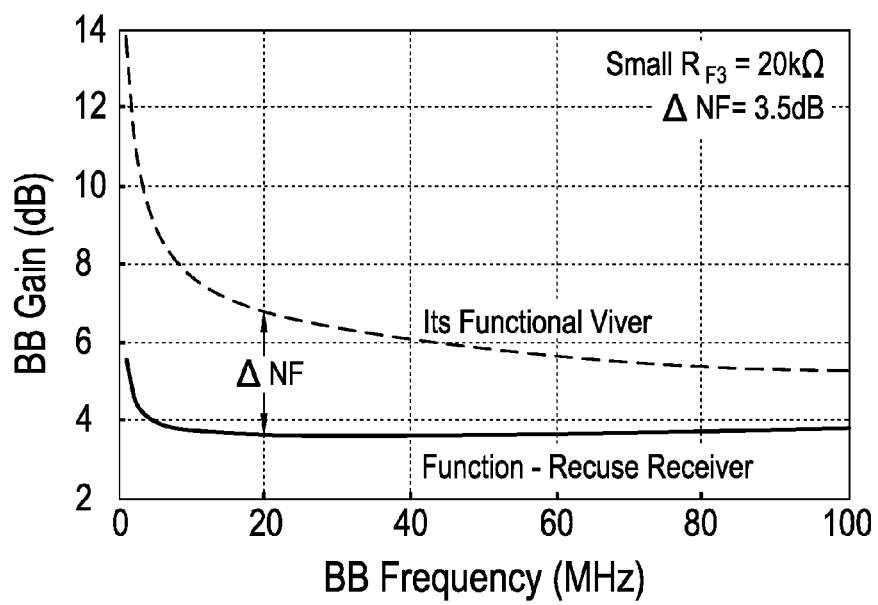
FIG. 11b is a diagram showing simulated BB NF of the function-reuse receiver and its functional view with a small RF3.
Figure 12A:
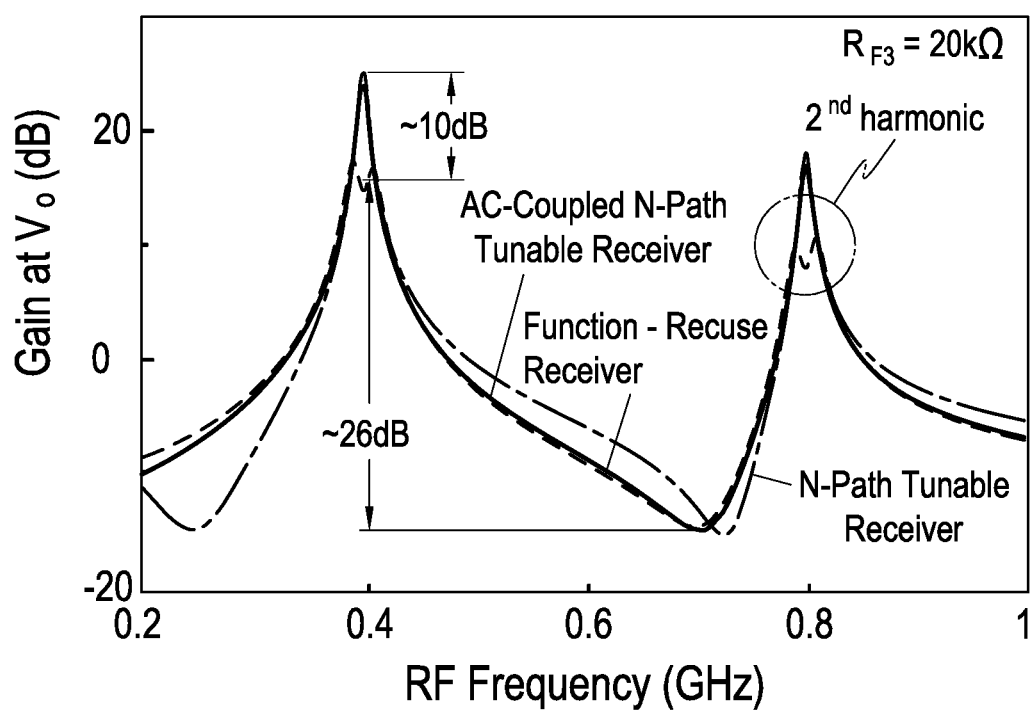
FIG. 12a is a diagram showing simulated RF gain responses at V0 for the three architectures: N-path tunable receiver, AC-coupled N-path tunable receiver and function-reuse receiver with a gain-boosted N-path SC network. The simulation parameters are $RL=800\Omega$, $Rs=50\Omega$, $gm1=4gm2=4gm3=20.55$ mS, $Ci=12.5$ pF, $fs=400$ MHz, $RF1=5$ k$\Omega$, $RF2=20$ K$\omega$ and $R_{F3}=20$ k$\Omega$.
Figure 12B:
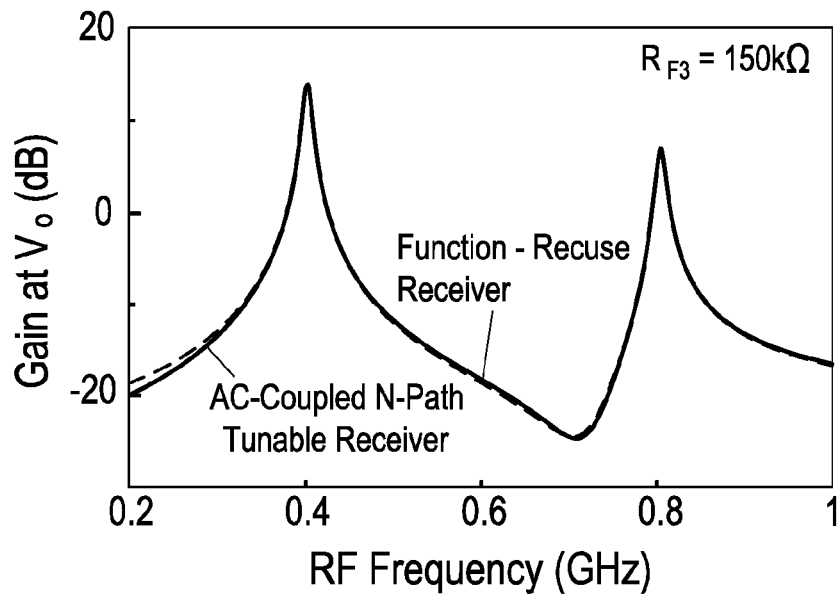
FIG. 12b is a diagram showing simulated RF gain responses at $V_O$ for the two architectures: AC-coupled N-path tunable receiver and function-reuse receiver with a gain-boosted N-path SC network. The simulation parameters are $RL=800\Omega$, $Rs=50\Omega$, $gm1=4gm2=4gm3=20.55$ mS, $Ci=12.5$ pF, $fs=400$ MHz, $R_{F1}=5$ k$\Omega$, $R_{F2}=20$ k$\Omega$ and $R_{F3}=150$ k$\Omega$.
Figure 12C:
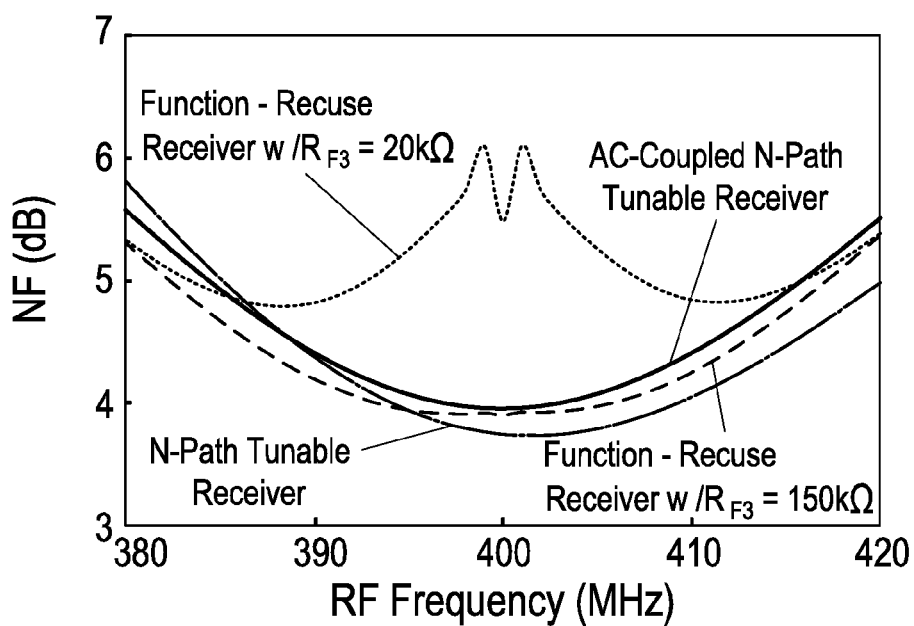
FIG. 12c is a diagram showing simulated RF NF at V0 for the three architectures: 4-path tunable receiver, AC-coupled 4-path tunable receiver and function-reuse receiver with a gain-boosted 4-path SC network. The simulation parameters are $RL=800\Omega$, $Rs=50\Omega$, $gm1=4gm2=4gm3=20.55$ mS, $Ci=12.5$ pF, $fs=400$ MHz, $RF1=5$ k$\Omega$ and $RF2=20$ k$\Omega$.

For the RF gain at $V_o$, the simulations results are shown in FIG. 12(a) for the three realizations. With relatively small feedback resistors $R_{F1}$=5 kΩ, $R_{F2}$=$R_{F3}$=20 kΩ, the function-reuse receiver has about 10 dB smaller IB gain than the other two. Also, there is a gain response appearing at the $2^{nd}$ harmonic, which is due to the single-ended realization. The IB gain loss of the function-reuse receiver can be compensated by increasing $R_{F3}$ from 20 to 150 kΩ, with all other parameters unchanged. The corresponding RF gain responses are plotted in FIG. 12(b). All results are consistent to each other (and this is also true for the BB gain). The NFs at the LNA's output $V_o$ are plotted in FIG. 12(c). With a small $R_{F1-3}$, the RF NF of the function-reuse receiver is higher due to a lower IB gain [the RF NF is also much higher than the BB NF, as shown in FIG. 11(b)]. However, with a large $R_{F3}$, the RF NF for the three architectures is almost equal since they have similar RF and BB gains as shown in FIG. 12 (a)-(b). From FIGS. 11 and 12, it can be concluded that, although the RF gain of the function-reuse receiver has ~10 dB difference, the difference in the BB NF is small (0.2 dB). However, for the functional view model, the BB NF has about 2-dB difference.

Low-Voltage Current-Reuse VCO-Filter

Figure 13:
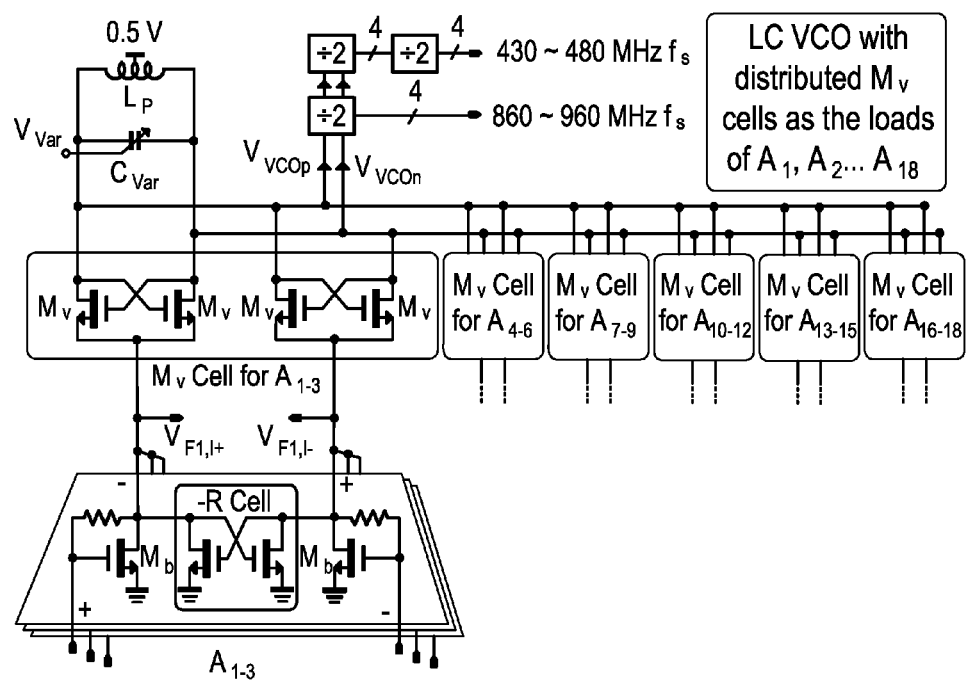
FIG. 13 is a schematic diagram showing a low voltage current-reuse VCO filter.
Figure 14A:
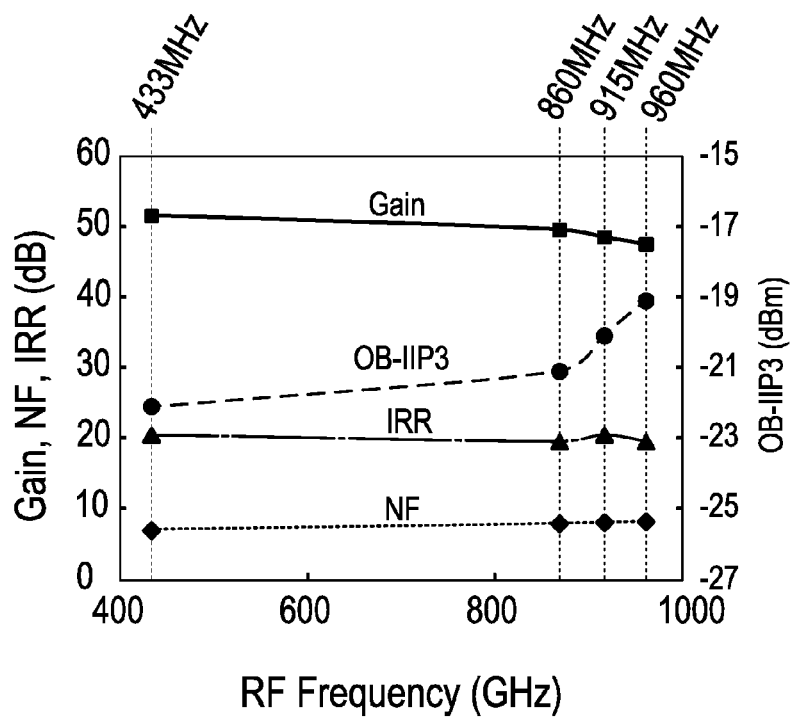
FIG. 14a is a diagram showing the measured key performance metrics: Gain, NF, IRR and OB-IIP3.
Figure 14B:
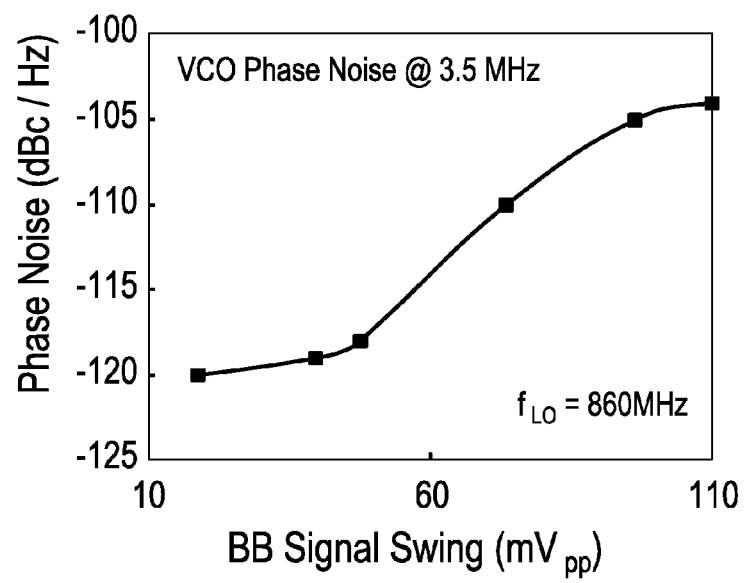
FIG. 14b is a diagram showing the measured key performance metrics: VCO phase noise versus BB signal swing.
Figure 14C:
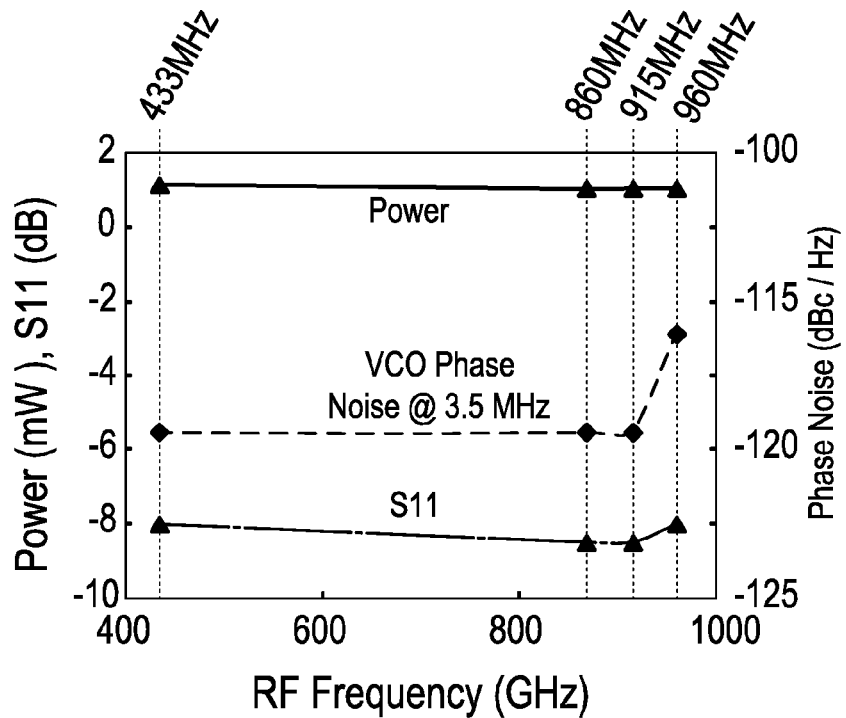
FIG. 14c is a diagram showing the measured key performance metrics: S11, power and VCO phase@3.5-MHz offset.
Figure 14D:
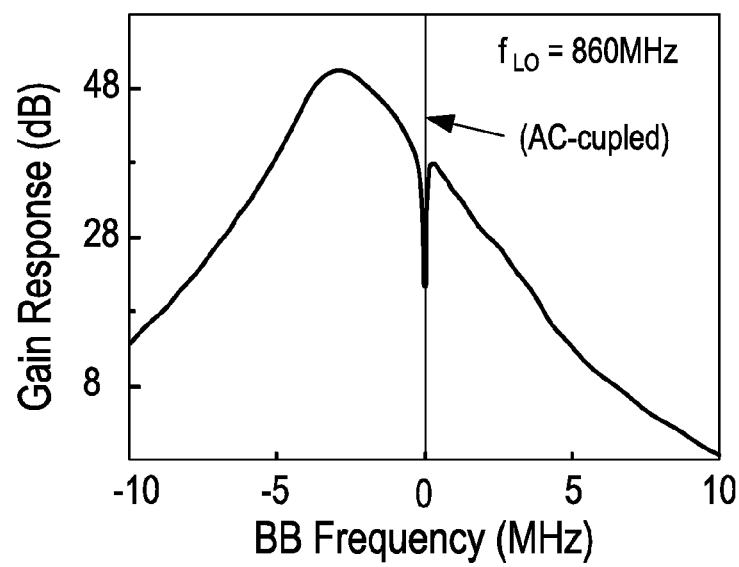
FIG. 14d is a diagram showing the measured key performance metrics: BB complex gain response centered at −2-MHz IF.

In order to further optimize the power, the VCO is designed to current-reuse with the BB complex low-IF filter (FIG. 13). The negative transconductor of the VCO is divided into multiple $M_V$ cells. The aim is to distribute the bias current of the VCO to all BB gain stages ($A_1, A_2 \ldots A_{18}$) that implement the BB filter. For the VCO, $M_V$ operates at the frequency of $2f_s$ or $4f_s$ for a div-by-2 or div-by-4 circuit. Thus, the VCO signal leaked to the source nodes of $M_V$ ($V_{F1,I+}$, $V_{F1,I-}$) is pushed to very high frequencies ($4f_s$ or $8f_s$) and can be easily filtered by the BB capacitors. For the filter's gain stages such as $A_1$, $M_b$ ($g_{Mb}$) is loaded by an impedance of ~$1/2g_{Mv}$ when $L_p$ can be considered as a short circuit at BB. Thus, $A_1$ has a ratio-based voltage gain of roughly $g_{Mb}/g_{Mv}$, or as given by $4Tg_{Mb}/G_{mT}$, where $G_{mT}$ is the total transconductance for the VCO tank. The latter shows how the distribution factor T can enlarge the BB gain, but is a tradeoff with its input-referred noise and can add more layout parasitics to $V_{vcop,n}$ (i.e., narrower VCO's tuning range). The −R cell using cross-coupled transistors is added at $V_{F1,I+}$ and $V_{F1,I-}$ to boost the BB gain without loss of voltage headroom. For the BB complex poles, $A_{2,5}$ and $C_{f1}$ determine the real part while $A_{3,6}$ and $C_{f1}$ yield the imaginary part. There are 3 similar stages cascaded for higher channel selectivity and image rejection ratio (IRR). $R_{blk}$ and $C_{blk}$ were added to avoid the large input capacitance of $A_{1,4}$ from degrading the gain of the front-end.

Results

Two versions of the multi-ISM-band sub-GHz ZigBee receiver were fabricated in 65-nm CMOS and optimized with a single 0.5-V supply. With (without) the LC tank for the VCO, the die area is 0.2 mm² (0.1 mm²). Since the measurement results of both are similar, only those measured with VCO in FIG. 14(a)-(d) are reported here. From 433 to 960 MHz, the measured BB gain is 50±2 dB. Following the linearity test profile, two tones at [$f_s$+12 MHz, $f_s$+22 MHz] are applied, measuring an OB-IIP3 of −20.5±1.5 dBm at the maximum gain. The IRR is 20.5±0.5 dB due to the low-Q of the VCO-filter. The IIP3 is mainly limited by the VCO-filter. The measured NF is 8.1±0.6 dB. Since the VCO is current-reuse with the filter, it is interesting to study its phase noise with the BB signal amplitude. For negligible phase noise degradation, the BB signal swing should be <60 mV$_{pp}$, which can be managed by variable gain control. If a 60-mV$_{pp}$ BB signal is insufficient for demodulation, a simple gain stage (e.g., inverter amplifier) can be added after the filter to enlarge the gain and output swing. The total power of the receiver is 1.15 mW (0.3 mW for the LNA+BB amplifiers and 0.65 mW for VCO-filter and 0.2 mW for the divider), while the phase noise is −117.4±1.7 dBc/Hz at 3.5-MHz frequency offset. The $S_{11}$ is below −8 dB across the whole band. The asymmetric IF response shows 24-dB (41-dB) rejection at the adjacent (alternate) channel.

Figure 15A:
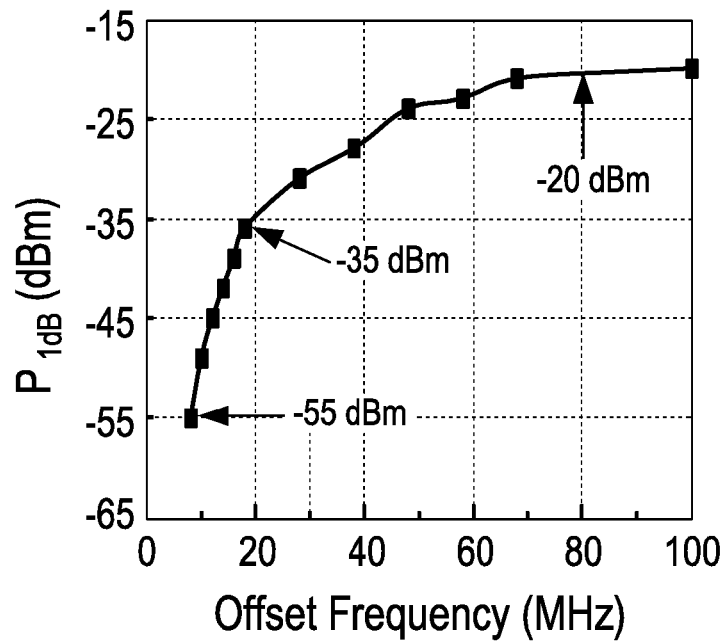
FIG. 15a is a diagram showing the measured P1 dB versus input offset frequency.
Figure 15B:
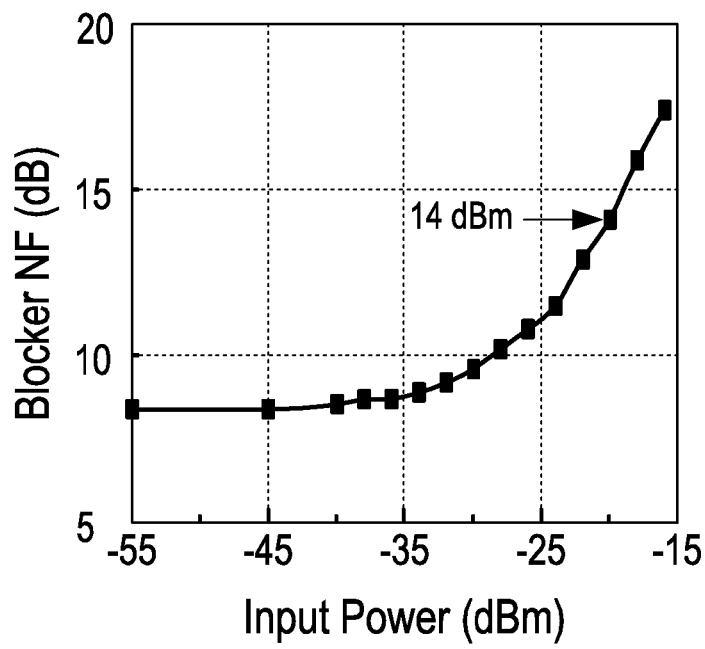
FIG. 15b is a diagram showing the measured blocker NF versus input power.

To study the RF filtering behavior, the $P_{1dB}$ and blocker NF are measured. For the in-band signal, the $P_{1dB}$ is −55 dBm while with a frequency offset frequency of 20 MHz, it increases to −35 dBm, which is mainly due to the double-RF filtering [FIG. 15(a)]. For an offset frequency of 60 MHz, the $P_{1dB}$ is −20 dBm, limited by the current-reuse VCO-filter. For the blocker NF, with a single tone at 50 MHz, the blocker NF is almost unchanged for the blocker <−35 dBm. With a blocker power of −20 dBm, the NF is increased to ~14 dB [FIG. 15(b)].

A function-reuse receiver embedding a gain-boosted N-path SC network has been proposed to realize a sub-GHz multi-ISM-band ULP ZigBee radio at a single 0.5-V supply. The featured improvements are fourfold: (1) unlike the usual receiver concept that is based on cascade of blocks, this receiver reuses one set of amplifiers for concurrent RF and BB amplification by arranging an N-path SC network in the feedback loop. Interestingly, this scheme decouples the BB STF (or NTF) from its RF STF (or NTF), allowing a lower BB NTF possible while saving power and area. This new receiver concept is good foundation for a deeper exploration of the topic. (2) The output BB NTF due to $R_{sw}$ and $R_F$ are greatly reduced, lowering the required size of the mixer switches and LO power. (3) Double-RF filtering is performed with one N-path SC network, improving the OB-IIP3 and tolerability of OB blockers. (4) A current-reuse VCO-filter further optimizes the power at just 0.5 V. All of these characteristics affirm the receiver as a potential candidate for emerging ULP radios for IoT applications that should support multi-band operation, being friendly to a single ULV supply for energy harvesting, and compact enough to save cost in nanoscale CMOS.

APPENDICES

A. Output-Noise PSD at BB for the N-Path Tunable Receiver

Figure 16:
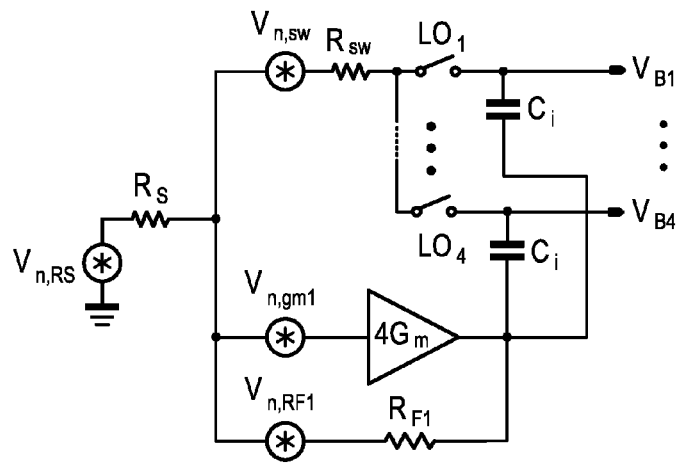
FIG. 16 is a schematic diagram showing an equivalent noise model of the N-path tunable receiver [FIG. 3(d)] for BB output-noise PSD calculation and simulation. N=4 is used. The noise sources gm1 and RF1 from the 4Gm are explicitly shown.

The derivation of the output-noise PSD at BB due to $R_s$, $4G_m$, $R_{sw}$ and $R_{F1}$ is presented here. The model used to obtain the NTFs is shown in FIG. 16. For all output-noise PSDs, there are two parts: one is the direct transfer from input RF to BB (Part A), while another is from harmonics folding noise (Part B). For the latter, increasing the path number N can reduce such contribution. The differential output-noise PSD for $R_s$, $4G_m$, $R_{sw}$ and $R_{F1}$ with $\overline{V_{n,R_s}^2} = 4KTR_E$, $\overline{V_{n,4Gm}^2} = 4KT/g_{m1}$, $\overline{V_{n,Rsw}^2} = 4KTR_{sw}$ and $\overline{V_{n,R_{F2}}^2} = 4KTR_{F1}$ are given as (12)-(15), $$\overline{V_{n,out,R_s}^2} = \left\{ \underbrace{|H_{-1,R_s}(j\omega)V_{n,R_s}(j\omega+\omega_s)|^2}_{\text{Part A}} + \underbrace{\sum_{n=-\infty, n\neq -1}^{\infty} |H_{n,R_s}(j\omega)V_{n,R_s}(j(\omega-n\omega_s))|^2}_{\text{Part B}} \right\} \times 4 \quad (12)$$

$$\overline{V_{n,out,4Gm}^2} = \left\{ \underbrace{|H_{-1,4Gm}(j\omega)V_{n,4Gm}(j\omega+\omega_s)|^2}_{\text{Part A}} + \underbrace{\sum_{n=-\infty, n\neq -1}^{\infty} |H_{n,4Gm}(j\omega)V_{n,4Gm}(j(\omega-n\omega_s))|^2}_{\text{Part B}} \right\} \times 4 \quad (13)$$

$$\overline{V_{n,out,R_{sw}}^2} = \left\{ \underbrace{|H_{-1,R_{sw}}(j\omega)V_{n,R_{sw}}(j\omega+\omega_s)|^2}_{\text{Part A}} + \underbrace{\sum_{n=-\infty, n\neq -1}^{\infty} |H_{n,R_{sw}}(j\omega)V_{n,R_{sw}}(j(\omega-n\omega_s))|^2}_{\text{Part B}} \right\} \times 4 \quad (14)$$

$$\overline{V_{n,out,R_{sw}}^2} = \left\{ \underbrace{|H_{-1,R_{F1}}(j\omega)V_{n,R_{F1}}(j\omega+\omega_s)|^2}_{\text{Part A}} + \underbrace{\sum_{n=-\infty, n\neq -1}^{\infty} |H_{n,R_{F1}}(j\omega)V_{n,R_{F1}}(j(\omega-n\omega_s))|^2}_{\text{Part B}} \right\} \times 4 \quad (15)$$

For the above NTFs, the even order terms (including zero) of n are excluded. The single-ended HTFs for $R_s$, $4G_m$, $R_{sw}$ and $R_{F1}$ are $H_{n,R_s}(j\omega)$, $H_{n,4Gm}(j\omega)$, $H_{n,R_{sw}}(j\omega)$ and $H_{n,R_{F1}}(j\omega)$, respectively. The derivation is similar to $H_{n,RF}(j\omega)$ in Section III-A. The only difference is on the linear state-space equation.

B. Derivation and Modeling of BB Gain and Output Noise for the Function-Reuse Receiver When considering the memory effect of the capacitor $C_i$ and $C_o$ with $R_{F3}$ sufficiently large, the voltages (i.e., the circuit states) at $C_i$ are independent. In the steady-state, around the clock frequency, the voltages sampling at $C_i$ are $\upsilon_{Ci}(t), j\upsilon_{Ci}(t), -\upsilon_{Ci}(t), -j\upsilon_{Ci}(t)$, while the voltage sampling at $C_o$ is $\upsilon_{Co}(t), j\upsilon_{Co}(t), -\upsilon_{Co}(t), -j\upsilon_{Co}(t)$, for $LO_{1-4}$, respectively. When $LO_1$ is high (K=1), linear analysis shows the following state-space description for capacitor $C_i$, $$\begin{cases} \frac{C_i d\upsilon_{Ci}(t)}{dt} = (\upsilon_{B1,I+}(t) + \upsilon_{B1,I-}(t) + \upsilon_{B1,Q+}(t) + \upsilon_{B1,Q-}(t))g_{m3} + \\ \qquad (\upsilon_{B2,I+}(t) + \upsilon_{B2,I-}(t) + \upsilon_{B2,Q+}(t) + \upsilon_{B2,Q-}(t))\frac{1}{4R_L} \\ \frac{\upsilon_{RF}(t) - \upsilon_i(t)}{R_s} = \frac{C_i d\upsilon_{Ci}(t)}{dt} \\ \upsilon_i(t) = \upsilon_{Ci}(t) + \upsilon_o(t) + R_{sw}\frac{C_i d\upsilon_{Ci}(t)}{dt} \\ \upsilon_i(t) - \upsilon_{B1,I+}(t) = \upsilon_{Ci}(t) \\ \upsilon_i(t) - \upsilon_{B1,I-}(t) = -\upsilon_{Ci}(t) \\ \upsilon_i(t) - \upsilon_{B1,I-}(t) = -\upsilon_{Ci}(t) \\ \upsilon_i(t) - \upsilon_{B1,Q+}(t) = j\upsilon_{Ci}(t) \\ \upsilon_i(t) - \upsilon_{B1,Q-}(t) = -j\upsilon_{Ci}(t) \\ \upsilon_o(t) + \upsilon_{co}(t) = \upsilon_{B2,I+}(t) \\ \upsilon_o(t) - \upsilon_{co}(t) = \upsilon_{B2,I-}(t) \\ \upsilon_o(t) + j\upsilon_{co}(t) = \upsilon_{B2,Q+}(t) \\ \upsilon_o(t) - j\upsilon_{co}(t) = \upsilon_{B2,Q-}(t) \end{cases} \quad (16)$$

Eq. (16) can be simplified similar to (1). Likewise, when $LO_1$ is low, it can be described by (4). Thus, it has the same BB HTFs as in gain-boosted N-path SC network [shown also in (8)].

Figure 17:
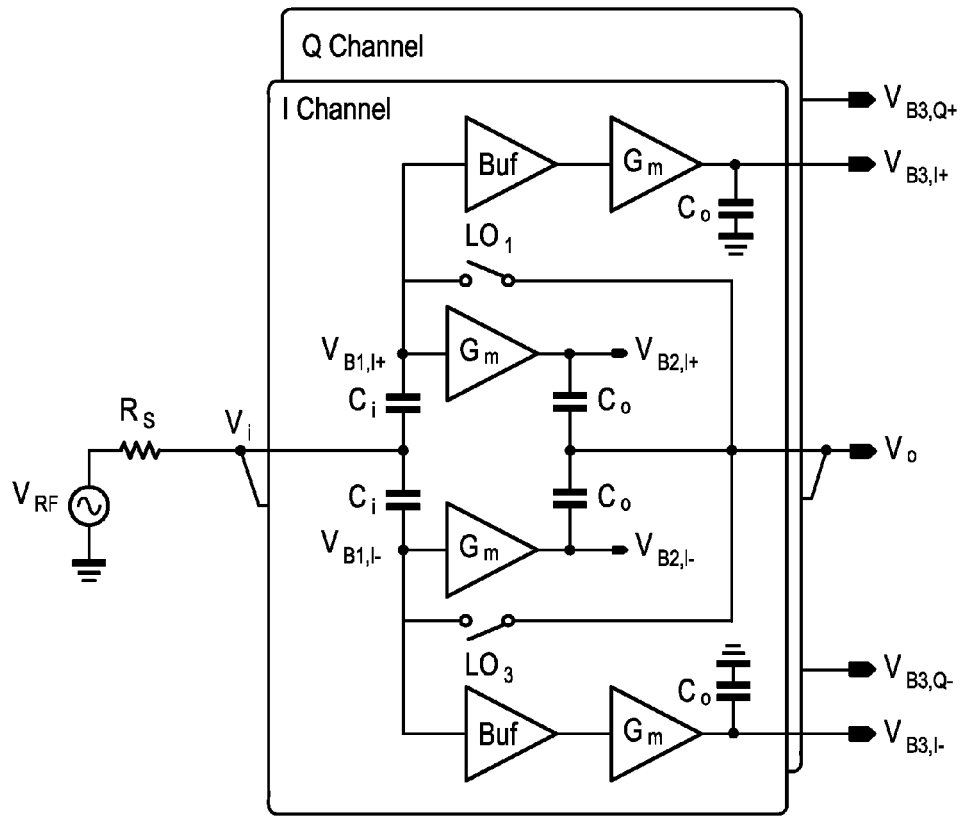
FIG. 17 schematic to model the BB NF of the functional-reuse receiver at VB2,I±.
Figure 18A:
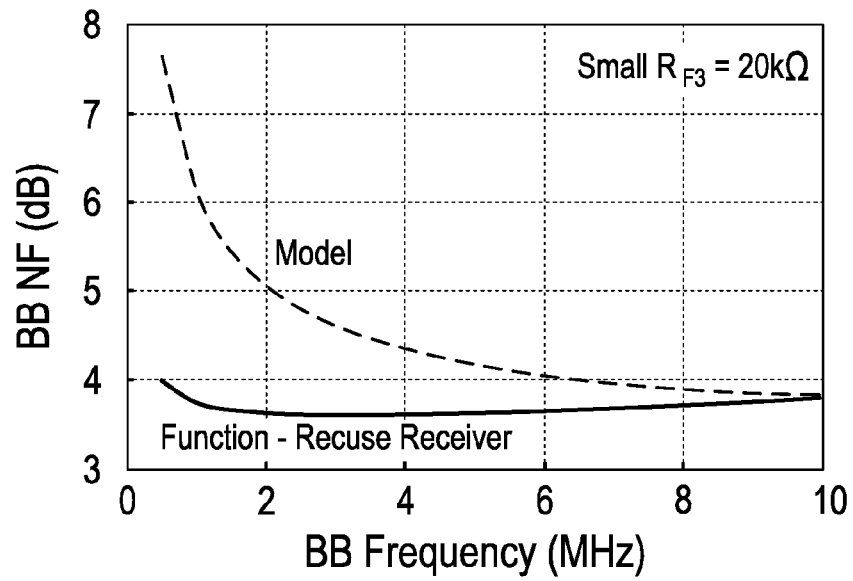
FIG. 18a is a diagram showing simulated BB NF from the model and functional-reuse receiver with a small RF3.
Figure 18B:
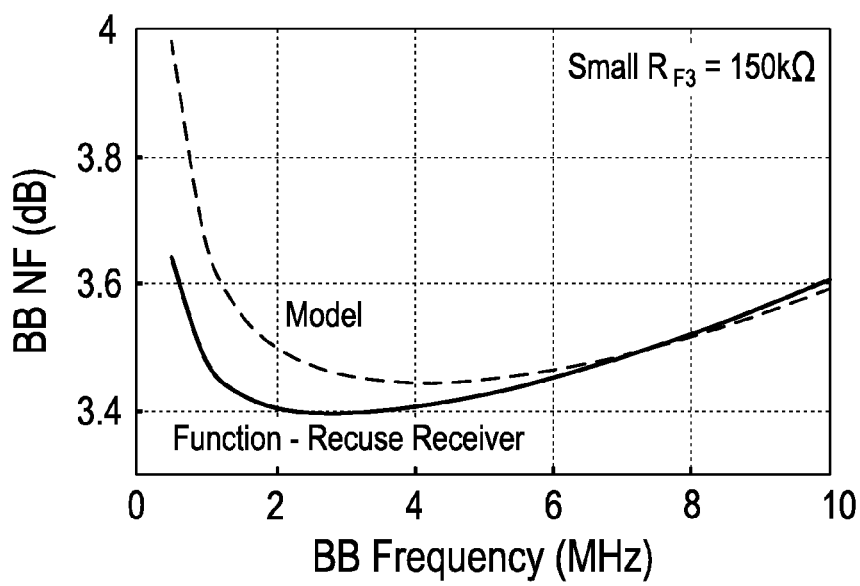
FIG. 18b is a diagram showing simulated BB NF from the model and functional-reuse receiver with a larger RF3.

The BB NF at $V_{B2,I\pm}$ ($V_{B2,Q\pm}$) is approximately modeled in FIG. 17. The BB output noise at $V_{B1,I\pm}$ ($V_{B1,Q\pm}$) are further amplified by two separate BB amplifiers, while in the function-reuse receiver they are amplified by the same BB amplifiers. From simulations, with a large $R_{F3}$, the model has a good accuracy, while for a small $R_{F3}$, the error increases for the low-frequency part. This is because the BB gain at $V_{B1,I\pm}$ ($V_{B1,Q\pm}$) gets smaller under a small $R_{F3}$, and the independent noise sources from the model's $G_m$ contribute additional noise [FIGS. 18(a) and (b)]. Still, this model is more accurate than that of the functional view [FIG. 18(c)]. For both cases, the function-reuse receiver has a smaller NF and requires lower power than the separated $G_m$ situation. For the BB gain, this model has a high accuracy (not shown).

Further Example Embodiments

The following examples pertain to further embodiments, from which numerous permutations and configurations will be apparent.

Example 1 is a gain-boosted n-path passive-mixer-first receiver, comprising: a transconductance amplifier; a number n of capacitors, connected to a output of the transconductance amplifier; a node, connected to an input of the transconductance amplifier; a resistor, connected to the input; and a number n of switches connected between the resistor and the capacitors.

Example 2 includes the subject matter of claim 1, wherein n can be any integer number equal or greater than 1.

Example 3 includes the subject matter of claim 1, wherein the switches are arranged in parallel.

Example 4 includes the subject matter of claim 1, wherein the capacitors arranged in parallel.

Example 5 includes the subject matter of claim 1, wherein one of the switches connected to one of the capacitors in series.

Example 6 includes the subject matter of claim 5, wherein a voltage signal is input to the receiver at the node.

Example 7 is a gain-boosted n-path passive-mixer-first receiver, comprising: a number n of switch-capacitor (sc) sets connected in parallel, wherein the sc sets have a first node and a second node; a resistor, connected to the first node; and a transconductance amplifier, connected to the resistor and the second node.

Example 8 includes the subject matter of claim 7, wherein n can be any integer number equal or greater than 1.

Example 9 includes the subject matter of claim 7, wherein the sc sets further comprises a number n of third nodes at a connection point between the switches and the capacitors.

Example 10 includes the subject matter of claim 9, wherein a voltage signal is input to the receiver at the first node, and a result voltage signal is output at one of the third nodes.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A gain-boosted n-path passive-mixer-first receiver, comprising:
   a number n of switch-capacitor (sc) sets connected in parallel, wherein the sc sets have a first node and a second node;
   a resistor, connected to the first node; and
   a transconductance amplifier, connected to the resistor and the second node;
   wherein each of the sc sets further comprises a third nodes at a connection point between the switch and the capacitor;
   wherein a high frequency voltage signal is input to an input of the transconductance amplifier, and a result low-frequency voltage signal is output at one of the third nodes;
   wherein the sc sets driven by a set of multiple-phase non-overlapping clock, with its clock frequency also defines the operating frequency of the receiver;
   wherein the low-frequency voltage signals at the third nodes have different phase with respect to each other.

2. The gain-boosted n-path passive-mixer-first receiver according to claim 1, wherein n can be any integer number equal or greater than 1.

* * * * *